(12) United States Patent
Yamauchi et al.

(10) Patent No.: US 7,123,538 B2
(45) Date of Patent: Oct. 17, 2006

(54) SEMICONDUCTOR MEMORY DEVICE FOR IMPROVING ACCESS TIME IN BURST MODE

(75) Inventors: Tadaaki Yamauchi, Hyogo (JP); Takashi Kubo, Hyogo (JP)

(73) Assignee: Renesas Technology Corp., Tokyo (JP)

( * ) Notice: Subject to any disclaimer, the term of this patent is extended or adjusted under 35 U.S.C. 154(b) by 212 days.

(21) Appl. No.: 10/940,777

(22) Filed: Sep. 15, 2004

(65) Prior Publication Data

US 2005/0057996 A1 Mar. 17, 2005

(30) Foreign Application Priority Data

Sep. 16, 2003 (JP) ............................. 2003-323476

(51) Int. Cl.
*G11C 8/00* (2006.01)
(52) U.S. Cl. ................. 365/230.03; 365/200; 365/205; 365/233
(58) Field of Classification Search ................ 365/200, 365/205, 230.03, 233
See application file for complete search history.

(56) References Cited

U.S. PATENT DOCUMENTS 6,668,345 B1 * 12/2003 Ooishi et al. ............... 714/710
6,731,400 B1 * 5/2004 Nakamura et al. ........... 358/1.9
2003/0135697 A1 7/2003 La

FOREIGN PATENT DOCUMENTS

| JP | 09-106669 | 4/1997 |
|---|---|---|
| JP | 9-106689 | 4/1997 |
| KR | 2003-0061217 | 7/2003 |

\* cited by examiner

*Primary Examiner*—Hoai V. Ho
(74) *Attorney, Agent, or Firm*—McDermott Will & Emery LLP

(57) ABSTRACT

A semiconductor memory device is disclosed. A block unit is divided into memory mats based on an internal address. In the case where the internal address is "1", data are read in ascending order in accordance with a start address from the memory mat, while the internal address is incremented by an address conversion circuit thereby to select a 4-word block including the words next selected from the memory mat. At the same time, the internal address is incremented based on the start address, so that the period for reading each word included in the lowest order of 4-word block can be secured. In the process, the address next to be input can be decoded.

12 Claims, 25 Drawing Sheets

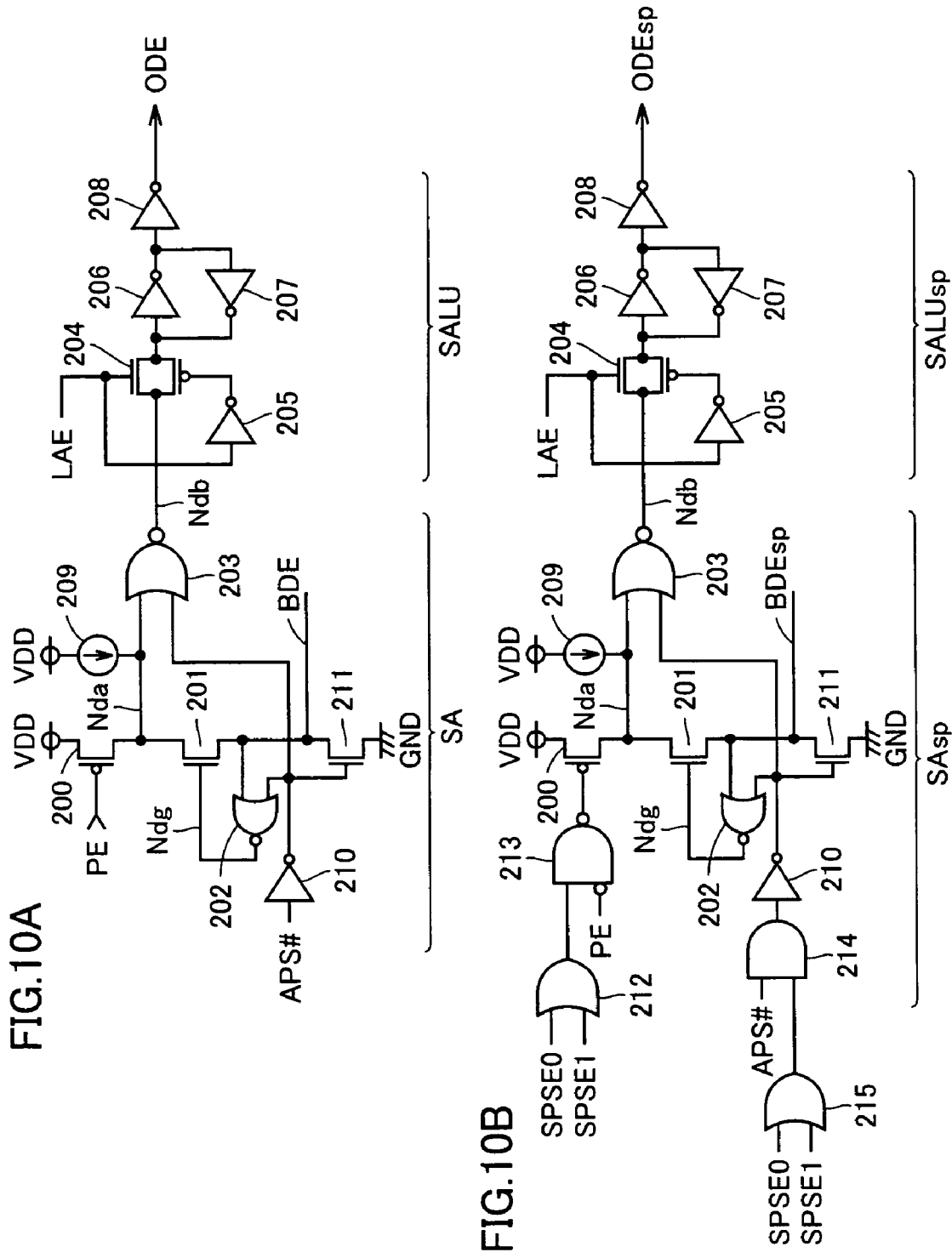

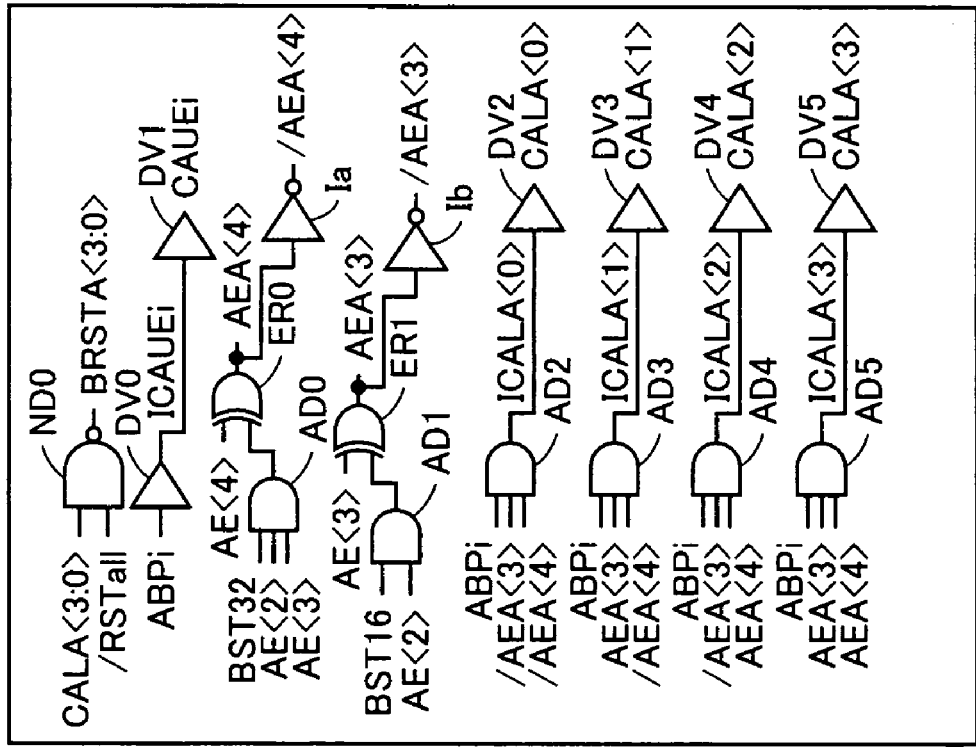
FIG.14C
FIG.14B
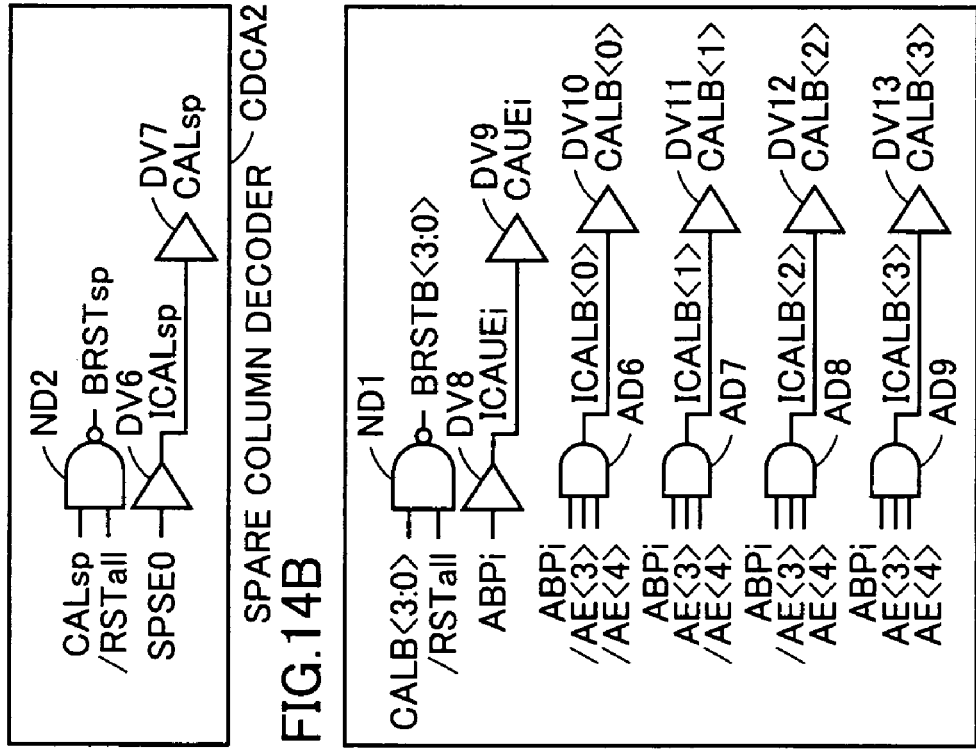
FIG.14A

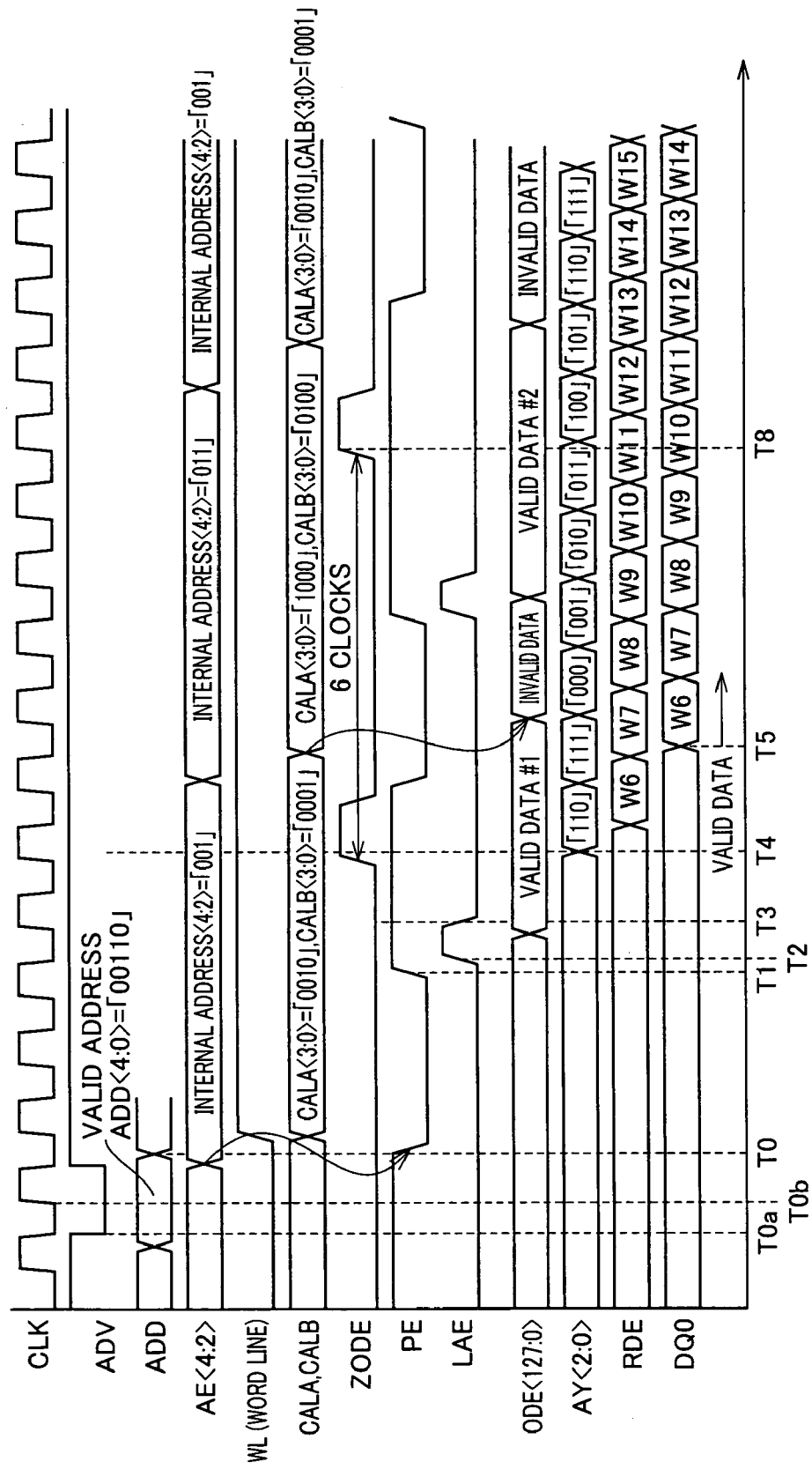

FIG.26

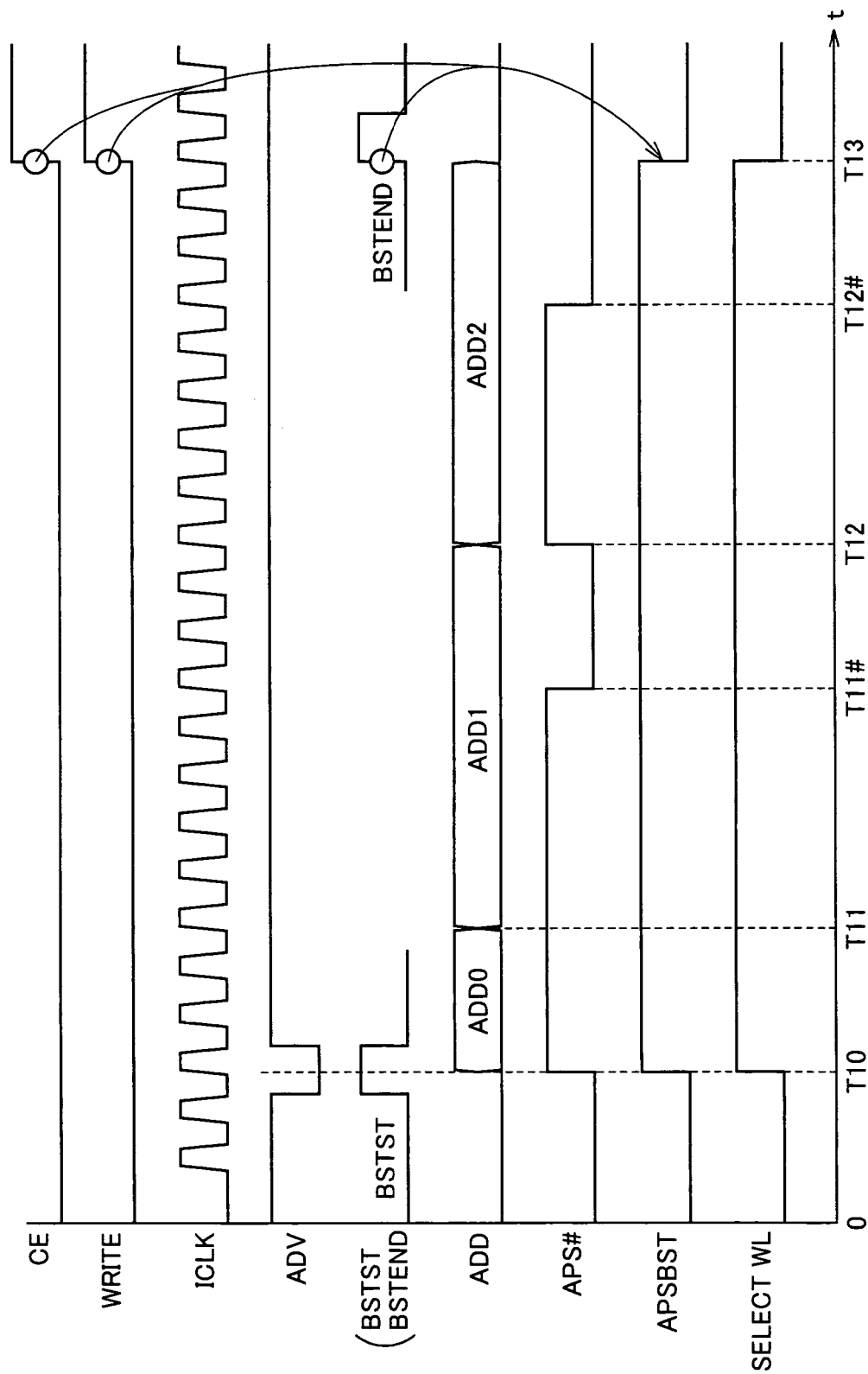

SEMICONDUCTOR MEMORY DEVICE FOR IMPROVING ACCESS TIME IN BURST MODE

BACKGROUND OF THE INVENTION

1. Field of the Invention

The present invention relates to a semiconductor memory device having a burst access mode capable of high-speed read operation.

2. Description of the Background Art

In recent years, the progress of the process technique has improved the integration degree of a semiconductor memory device with an increased operating speed. Especially, the operating speed of the CPU (Central Processing Unit) has remarkably increased. In keeping with the operating speed of the CPU, therefore, the program data stored in the semiconductor memory device is required to be read at high speed. Demand is high, therefore, for an increased speed of the read operation of the semiconductor memory device.

Specifically, the music information and the image information such as animation have come to be stored in a single semiconductor chip. The music information can now be reproduced through the speaker or the image information can be reproduced on the display screen of a display unit. Variations in the speed of reading the music information or the image information would cause discontinuous music or image reproduction and give the sense of discomfort to the user.

The music information and the image information, therefore, are required to be read at high uniform speed. As a method to meet the requirement of high-speed access to the semiconductor memory device described above, the operation of the semiconductor memory device has come be performed in burst mode. Specifically, in burst mode, an address that is the base of the burst read operation of data, for example, is applied to the semiconductor device, and the data corresponding to each page are latched and read at a time. The addresses required for the burst read operation from the latch are generated continuously in the internal circuits and read sequentially. Accordingly, the address is not required to be read anew each time and a high-speed access can be achieved in reading a memory array.

For example, the memory cell data of 16 words of Nos. 0 to 15 are read, and while these 16-word data of numbers 0 to 15 are being output, the data of 16 words of Nos. 16 to 31 are read from the memory cell. This reading process is sequentially repeated. In this specification, one word is assumed to represent 16-bit data.

In the burst mode operation described above, each time one page has been read, the address of the next page is given to the semiconductor memory device anew. The decoding process of the input address in the next page readout should be carried out within the page readout time from the memory array by the sense amplifier.

Specifically, consider a case in which a given page is read with the start address for 15th data in the aforementioned example. The read time for only the 16th data can be secured. Therefore, no time margin can be secured for reading from the memory cell, thereby leading to the problem that it is difficult to output the data continuously.

In order to obviate this disadvantage, Japanese Patent Laying-Open No. 9-106689 discloses a method in which a sense amplifier and a latch circuit are arranged on each of the bit lines for reading the data of a memory array to eliminate the requirement of inputting a new address each time the page is switched. According to this method, the data are collectively read from all the bit lines and stored in a corresponding latch. A new address input is not required, therefore, at other than the time of switching the word line, thereby making high-speed read/write operation possible. In the system using the semiconductor memory device, therefore, the page read time is eliminated at the time of switching the page for an improved overall processing speed.

In the conventional semiconductor memory device described above, the fact that each bit line has a corresponding sense amplifier and a latch circuit for storing the data from the sense amplifier can shorten the access time can be shortened. Since the sense amplifiers and the latches occupy a large area of the chip, however, the disadvantage is encountered that the chip area is increased as compared with the ordinary semiconductor memory device.

Also, the provision of a sense amplifier for each bit line greatly increases the power consumption for reading the data. In an application to a battery-driven portable information device, therefore, the operating time of the portable information device is undesirably shortened.

SUMMARY OF THE INVENTION

An object of the present invention is to solve the problems described above and to provide a semiconductor memory device in which the access time is improved in burst mode without increasing the chip area and power consumption.

According to the present invention, there is provided a semiconductor memory device including a memory cell array, a burst address generating circuit, a first select circuit, a second select circuit and a data select circuit. The memory cell array includes a plurality of memory cells arranged in an array in which an address is selected by first address bits and second address bits less significant than the first address bit. The memory cell array is divided into first and second memory blocks based on the more significant bit of the second address bits. The burst address generating circuit generates address signals sequentially from the start address to start the read operation in the burst mode for continuously reading a predetermined number of data in the memory cell array. The first select circuit corresponds to the first memory block and includes an address conversion circuit which, in the case where the more significant bit of the second address bits in the address signal meets predetermined conditions, uses an address conversion signal obtained by incrementing the first address bits of the address signal as the first address bit signal of the address signal. The first select circuit selects first data of a predetermined number of memory cells from the first memory block based on the output from the address conversion circuit. The second select circuit corresponds to the second memory block and selects second data of a predetermined number of memory cells from the second memory block based on the first address bits of the address signal. The data select circuit selects the first data and the second data sequentially based on the second address bits of the address signal.

The semiconductor memory device according to the present invention includes the address conversion circuit which, in the case where the more significant bit of the second address bits meets predetermined conditions, uses the address conversion signal obtained by incrementing the first address bits as the first address bits of the address signal. As a result, the first and second data can be read sequentially from the first and second memory blocks based on the select operation in accordance with different first address bits.

The predetermined conditions are the fact that the start address is located in the second memory block, and the first data is read after selecting the second data.

Under predetermined conditions, the data can be sequentially read at high speed from the second memory block to the first memory block.

A select operation of the first select circuit and the second select circuit are performed in parallel to each other.

Also, the parallel operation allows the data select circuit to have a margin of the select operation.

The foregoing and other objects, features, aspects and advantages of the present invention will become more apparent from the following detailed description of the present invention when taken in conjunction with the accompanying drawings.

BRIEF DESCRIPTION OF THE DRAWINGS

FIGS. 10A and 10B are diagrams showing the circuit configuration of the sense amplifier and the SA latch unit;

FIGS. 14A to 14C are diagrams showing a circuit configuration of column decoders and a spare column decoder for executing the address conversion process to execute the burst method according to the present invention;

FIG. 15 is a timing chart for executing the data read operation in accordance with the method in burst mode according to the present invention;

FIG. 26 is a diagram showing a general configuration of a memory device according to a third embodiment of the present invention;

FIG. 30 is a timing chart for describing the activation period of the control signals in APS mode according to the third embodiment of the present invention.

DESCRIPTION OF THE PREFERRED EMBODIMENTS

Figure 1:
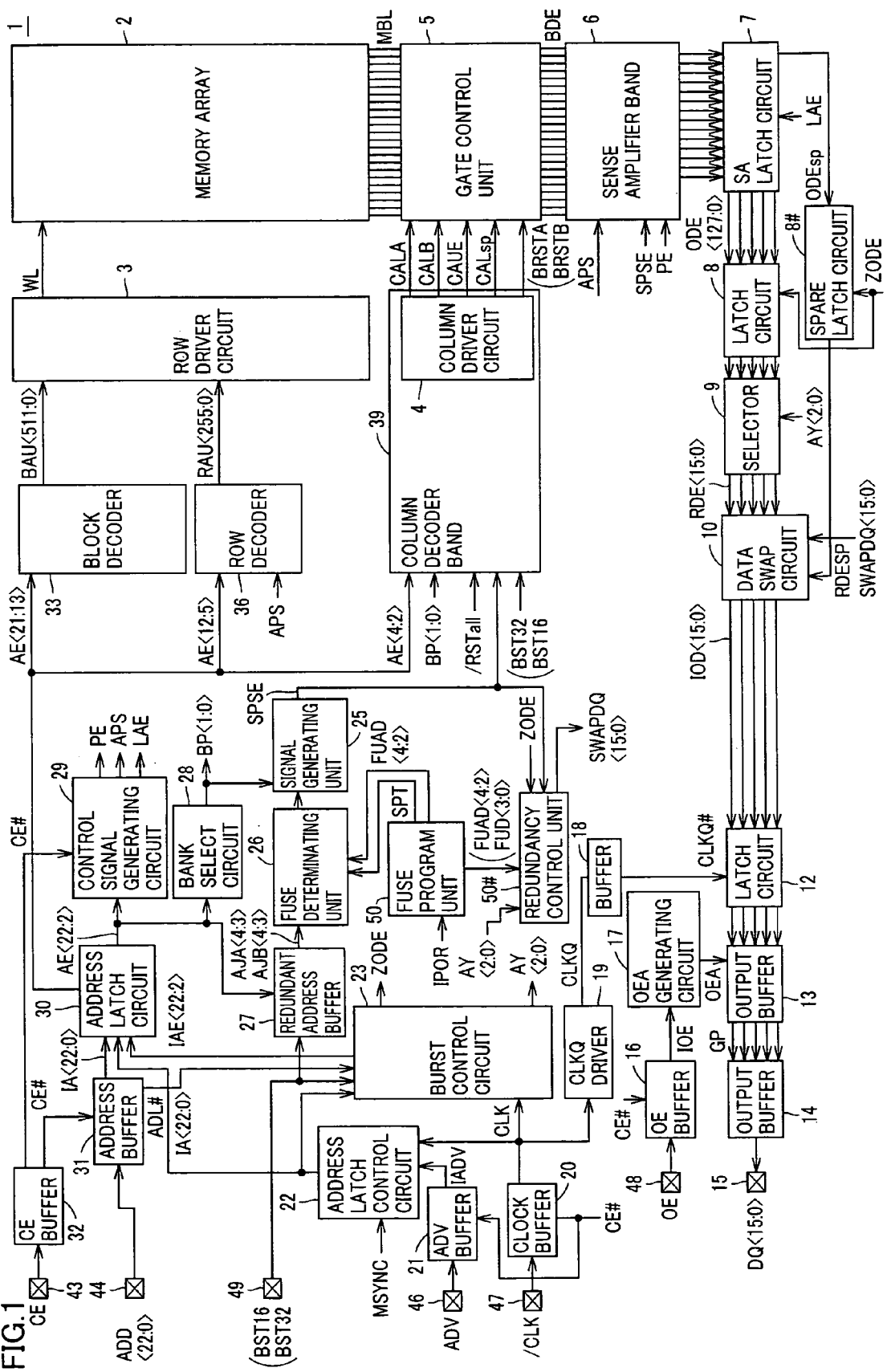
FIG. 1 is a diagram showing a general configuration of a memory device according to an embodiment of the present invention.

Embodiments of the present invention will be described in detail below with reference to the drawings. In the drawings, the same or equivalent component parts are designated by the same reference numerals, respectively.

With reference to FIG. 1, a memory device 1 according to an embodiment of the present invention includes a memory array 2 having a plurality of memory cells integrally arranged in matrix, a row driver circuit 3 for driving a plurality of word lines WL corresponding to the memory cell rows of the memory array, a gate control unit 5 for selecting a memory cell column of the memory array, a column decoder band 39 for selecting a memory cell column in gate control unit 5, a sense amplifier band 6 for amplifying the data of the memory cells selected by gate control unit 5 and a SA latch circuit 7 for latching the data read and amplified by sense amplifier band 6.

Memory device 1 further includes a latch circuit 8 for latching, at a predetermined timing, data signal ODE<127:0> latched in SA latch circuit 7, a selector 9 for ⅛ selection of the data signal latched in latch circuit 8, in response to the input of an internal address AY<2:0>, a data swap circuit 10 for executing the swap operation between the redundant data signal and the normal data signal, a latch circuit 12 for latching the data signal output from data swap circuit 10, and output buffers 13, 14 for outputting the data signal latched from the latch circuit 12 to data output terminal 15. Also, memory device 1 includes a spare latch circuit 8# used for redundancy which latches the data signal ODEsp latched in SA latch circuit 7 at a predetermined timing and outputs a redundant data signal RDESP for executing the swap operation in data swap circuit 10.

Further, memory device 1 includes an address terminal 44, and in response to the input of address ADD<22:0> to address terminal 44, the row and column select operation is executed to output a predetermined read data from data output terminal 15. Also, memory device 1 includes an enable terminal 43, and in response to control signal CE input from enable terminal 43, control signal CE# ("0") is generated in CE buffer 32 and transmitted to each circuit.

Address ADD<22:0> input to address terminal 44 is processed by an address buffer 31 and output to address latch circuit 30 as an internal address IA<22:0> at the time of asynchronization.

Also, address ADD<22:0> input from address terminal 44 is output from address buffer 31 to burst control circuit 23 at the time of synchronization, and a part of the address is incremented by the burst counter in burst operation mode by burst control circuit 23 and output to address latch circuit 30.

Burst control circuit 23, in response to the input of internal address IA<22:0> from address buffer 31, outputs internal address IA<22:2> in synchronism with clock CLK as an internal address IAE<22:2> to address latch circuit 30.

Address latch circuit 30 latches the internal address output from address buffer 31 or burst control circuit 23 and outputs it as an internal address AE<22:2> to each circuit. Incidentally, burst control circuit 23 and address latch circuit 30 make up a burst address generating circuit for generating a signal to select an address.

Control signal generating circuit 29, in response to the input of internal address AE<22:2> transmitted from address latch circuit 30, generates a control signal PE for giving an instruction on the precharge operation before the data read operation in sense amplifier band 6, a control signal APS used for defining what is called the APS mode and a control signal LAE for giving an instruction on the latch operation in SA latch circuit 7. The APS (Automatic Power Saving) mode deactivates a selected word line forcibly after the lapse of a predetermined period from the time when the particular work line is selected. In this way, power consumption is reduced.

A bank select circuit 28 selects one of the two banks into which the memory array is divided, based on the input to internal address AE from address latch circuit 30. Specifically, in response to the input of address AE<22> to bank select circuit 28, a bank select signal BP<1:0> is output.

A block decoder 33 outputs a control signal BAU<511:0> to a row driver circuit 3 by predecoding internal address AE<21:13> output from address latch circuit 30. Based on the predecode signal of this block decoder 33, one selected block is designated. Specifically, one area block divided into 512 parts of memory array 2 is designated by control signal BAU<511:0> of block decoder 33. In this embodiment, description will be given of an eye on block BU selected by block decoder 33. Assume that block BU selected by block decoder 33 represents a unit erasure amount.

A row decoder 36, based on the input of internal address AE<12:5>, outputs predecoded control signal RAU<255:0> to row driver circuit 3. Control signal RAU is used for 1/256 selection of word line WL arranged in the block selected by block decoder 33.

Specifically, in one block selected by block decoder 33, the row select operation is carried out by selecting one word line WL based on internal address AE<12:5>.

A column decoder band 39 includes a column driver circuit 4, controls column driver circuit 4 based on the input of internal address AE<4:2> and bank select signal BP<1:0> and outputs control signals CALA, CALB, CAUE, CALsp and control signals BRSTA, BRSTB for driving gate control unit 5. Based on this, the column select operation is carried out in gate control unit 5, so that data are read based on the row and column select operation.

Clock terminal 47, in response to the input of external clock /CLK, transmits it to clock buffer 20, which in turn, based on the input of control signal CE#, outputs internal clock CLK to address latch control circuit 22, burst control circuit 23 and CLKQ driver 19. CLKQ driver, in response to internal clock CLK, outputs clock CLKQ. Buffer 18, in response to the input of clock CLKQ, outputs clock CLKQ# to latch circuit 12.

Control terminal 46, in response to control signal ADV, outputs it to ADV buffer 21, which in turn, based on the input of control signal CE#, outputs control signal IADV to address latch control circuit 22. Address latch control circuit 22, based on the input of control signal MSYNC for defining the synchronous operation and control signal IADV, outputs control signal ADL# for controlling the timing of retrieving the external address by address latch circuit 30 in synchronism with internal clock CLK output from clock buffer 20. Control signal MSYNC defines synchronization/asynchronization, and in the state of "1", executes the synchronous operation in synchronism with the clock. In the state of "0", on the other hand, the asynchronous operation is carried out.

Control terminal 48, in response to the input of control signal OE, outputs it to OE buffer 16. The OE buffer 16 is activated based on control signal CE# and outputs control signal IOE. OEA generating circuit 17, in response to the input of control signal IOE, outputs control signal OEA for activating output buffer 13.

Burst control circuit 23, based on the input of control signals BST16, BST32 input from control terminal 49, increments a predetermined part of the bits of internal address IA<22:0> transmitted from address buffer 31, in synchronism with internal clock CLK in accordance with a predetermined burst operation while at the same time outputting various control signals.

Also, this configuration includes various circuits for executing the operation of a redundant system.

Specifically, this configuration includes a redundant address buffer 27 supplied with internal address AE<22:2> from address latch circuit 30 for outputting addresses AJA<4:3>, AJB<4:3> for determining redundancy, a fuse determining unit 26 supplied with the input of addresses AJA<4:3>, AJB<4:3> for comparing them with the redundant address programmed in fuse program unit 50, a signal generating unit 25 for outputting control signal SPSE in response to the determining operation of fuse determining unit 26, a fuse program unit 50 supplied with the input of control signal IPOR for outputting a preprogrammed redundant address FUAD<4:2> and redundant bit data FUD<3:0> and an activation signal SPT and a redundancy control unit 50# for generating, based on these signals, a control signal SWAPDQ<15:0> for controlling the swap operation. The operation of the redundant system will be described in detail later. Control signal IPOR is generated from what is called a power-on reset circuit not shown.

Figure 2:
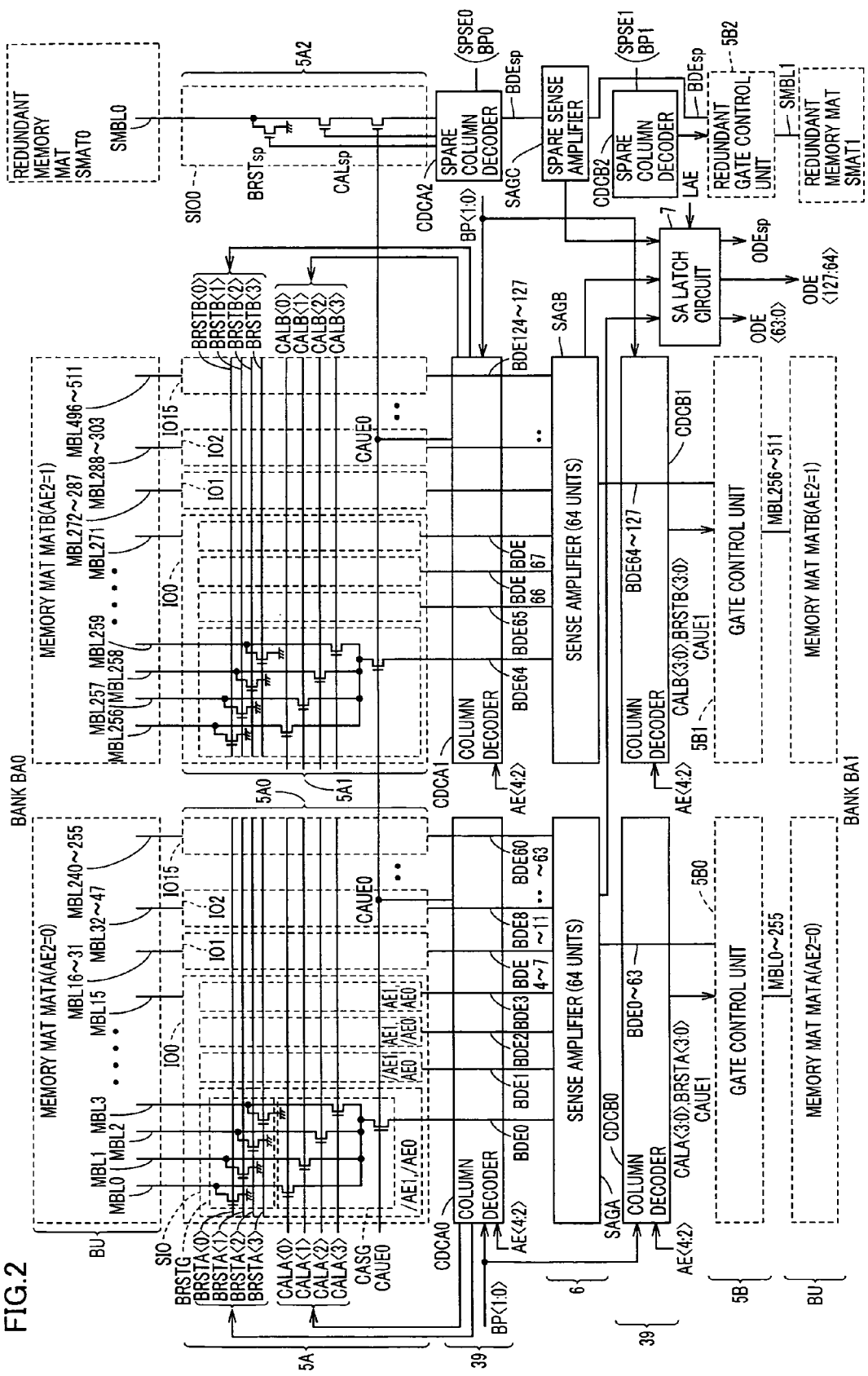
FIG. 2 is a diagram showing a circuit configuration for describing in detail a memory array structure, gate control units and a sense amplifier band according to an embodiment of the present invention.

FIG. 2 shows a configuration of memory array 2 according to an embodiment of the present invention divided into two parts by banks BA0, BA1 each including one block BU selected by block decoder 3. Although banks BA0 and BA1 have the same configuration, the configuration of BA0 will be described as a typical one. Block BU of bank BA0 has two memory mats MATA, MATB into which bank BA is divided.

Memory mat MATA has a plurality of bit lines MBL0 to MBL255 corresponding to memory cell columns, respectively. Memory mat MATB has a plurality of bit lines MBL256 to MBL511 corresponding to the memory cell columns, respectively.

Also, sense amplifier band 6 has arranged therein sense amplifiers SAGA corresponding to memory mat MATA and sense amplifiers SAGB corresponding to memory mat MATB, each including 64 sense amplifiers SA.

Sense amplifier band 6 is shared by banks BA0 and BA1 and adapted to execute the burst operation for one of the banks. In this configuration, the burst operation of bank BA0 is described as a typical example. The use of sense amplifier band 6 for both banks BA0 and BA1 can reduce the area occupied by the device.

In this configuration, sense amplifiers SAGA and SAGB are operated in parallel to read 128 bits, i.e., 16 words in parallel.

The amplified data signal from sense amplifier band 6 is output to SA latch circuit 7, and in response to control signal LAE, latched and output as read data ODE<127:0>. FIG. 2 shows the data amplified by sense amplifiers SAGA and latched and output as read data ODE<63:0> in response to control data LAE. Also, the data signal amplified by sense amplifiers SAGB is latched in response to control signal LAE and output as read data ODE<127:64>. Further, the amplified data signal from redundancy spare sense amplifier SAGC is latched in response to control signal LAE and output as read data ODEsp.

Gate control unit 5 has a subgate control unit SA corresponding to bank BA0 and a subgate control unit 5B corresponding to bank BA1. Subgate control unit 5A has a gate control unit 5A0 corresponding to memory mat MATA and a gate control unit 5A1 corresponding to memory mat MATB.

In a similar manner, subgate control unit 5B has gate control units 5B0, 5B1 corresponding to memory mats MATA, MATB, respectively, of bank BA1. Banks BA0 and BA1 have a similar configuration and therefore, in this embodiment, only the configuration of bank BA0 will be described in detail.

Column decoder band 39 has a column decoder CDCA0 for executing the column select operation of memory mat MATA and a column decoder CDCA1 for executing the column select operation of memory mat MATB. Column decoder CDCA0 outputs control signal CALA<3:0> and control signal BRSTA<3:0> based on the input of internal address AE<4:2> and bank select signal BP<1:0>. Further, control signal CAUE0 is output. In this embodiment, the select operation of column decoder CDCA0 (first select circuit) and column decoder CDCA1 (second select circuit) are described as parallel operation. Without parallel operation, however, a first select operation which is to be carried out first may be followed by the next select operation before the first select operation is finished.

Gate control unit 5A0 includes gate circuits IO0 to IO15 corresponding to each set of 16 bit lines MBL, and each gate circuit IO is divided into sets of four bit lines and has a subgate circuit SIO corresponding to each bit line set. FIG. 2, for example, shows subgate circuit SIO corresponding to bit lines MBL0 to MBL3 of memory mat MATA.

Subgate circuit SIO includes a reset gate BRSTG for resetting by electrically connecting each bit line MBL to a grounding voltage GND and a column select gate CASG. Reset gate BRSTG has a transistor corresponding to each bit line MBL and electrically connected to grounding voltage GND. Each of bit lines MBL0 to MBL3 is reset by the turning on of each transistor in response to the input of control signals. BRSTA<0> to BRSTA<3>, respectively.

Column select gate CASG has a transistor corresponding to each bit line MBL, and in response to the input of control signal CALA<3:0>, selects a corresponding bit line. In response to the input of control signal CAUE0, data line BDE0 and bit line MBL selected from four bit lines are electrically connected to each other. Specifically, in the configuration of this memory mat MATA, four bits of signal are output each time from gate circuit IO, and a total of 64 bits of data signal are transmitted to data lines BDE0 to BDE63. Based on the signal transmitted to the data lines, sense amplifiers SAGA performs the amplification, outputs the signal and transmits it to SA latch circuit 7. Memory mat MATB also has a similar configuration, in which sense amplifiers SAGB amplify the signal transmitted to the data line and output the amplified signal to SA latch circuit 7.

Also, the redundant structure of this configuration further includes redundant memory mats SMAT0, SMAT1, redundant control units 5A2, 5B2, spare column decoders CDCA2, CDCB2 for driving redundant control units 5A2, 5B2 corresponding to banks BA0, BA1, respectively, and a spare sense amplifier SAGC.

This embodiment includes one redundant bit line SMBL0 of redundant memory mat SMAT0 and a redundant bit line SMBL1 of redundant memory mat SMAT1. Spare column decoder CDCA2 outputs control signals CALsp and BRSTsp based on control signal SPSE0 and bank select signal BP0. Redundant gate control unit 5A2 electrically connects bit line SMBL0 and redundant data line BDEsp to each other in response to control signal CALsp and control signal CAUE0. The spare sense amplifier amplifies and outputs the read data to SA latch circuit 7. The configuration is similar also for the redundant structure of bank BA1. Specifically, spare column decoder CDCB2 drives redundant gate control unit 5B2 based on bank select signal BP and control signal SPSE1.

Figure 3:
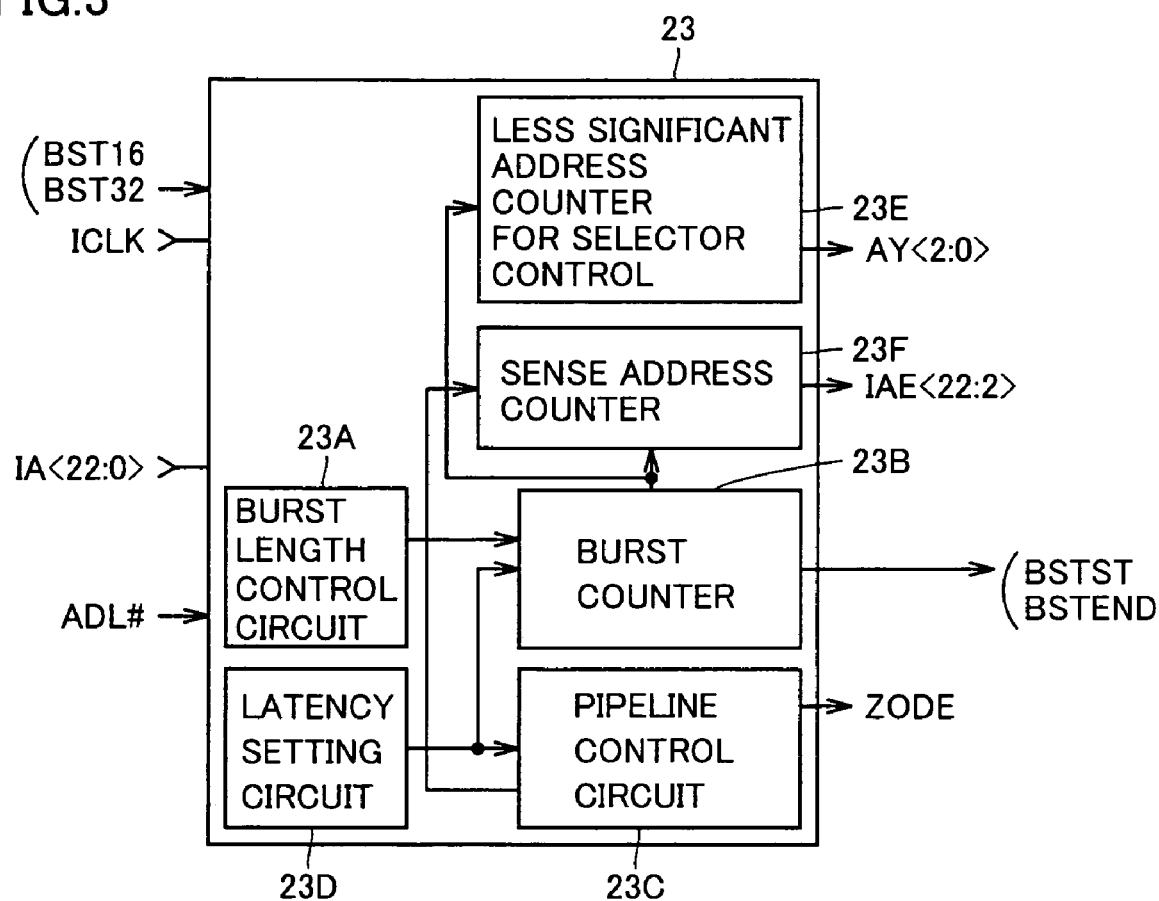
FIG. 3 is a diagram schematically showing a block configuration of a burst control circuit according to an embodiment of invention.

Referring to FIG. 3, burst control circuit 23 according to an embodiment of the present invention includes a burst length control circuit 23A, a burst counter 23B, a pipeline control circuit 23C, a latency setting circuit 23D, a selector control low-order address counter 23E and a sense address counter 23F.

Burst length control circuit 23A, in response to the input of control signals BST16, BST32 to burst control circuit 23, outputs to burst counter 23B the control signal for controlling the burst length defining the number of continuously output data. Burst counter 23B generates control signal BSTST indicating the burst operation starting time at a timing controlled by latency setting circuit 23D, and with this as a reference, outputs control signal BSTEND defining the end of the burst period. The burst operation is started in response to the input of internal clock CLK and control signal ADL# output at the time of latching an external address. Once the burst operation is started, an address AY<2:0> counted up for each clock period is generated from selector control low-order address counter 23E with internal address IA<2:0> input at the time of burst operation as an origin. On the other hand, sense address counter 23F for selecting a memory array is controlled by pipeline control circuit 23C. Sense address counter 23F counts up and outputs internal address IAE<22:2> as soon as control signal ZODE falls with internal address IA<22:2> input at the time of burst operation as an origin. AY<2:0> generated by selector control low-order address. counter 23E and internal address IA<22:2> are internal addresses independent of each other.

Latency setting circuit 23D outputs a control signal for defining the output period of the data for operation between the circuits in memory device 1 to burst counter 23B and pipeline control circuit 23C. Pipeline control circuit 23C, based on the control signal input from latency setting circuit 23D at the time of burst operation, outputs timing control signal ZODE retrieved into the latch circuit.

Figure 4:
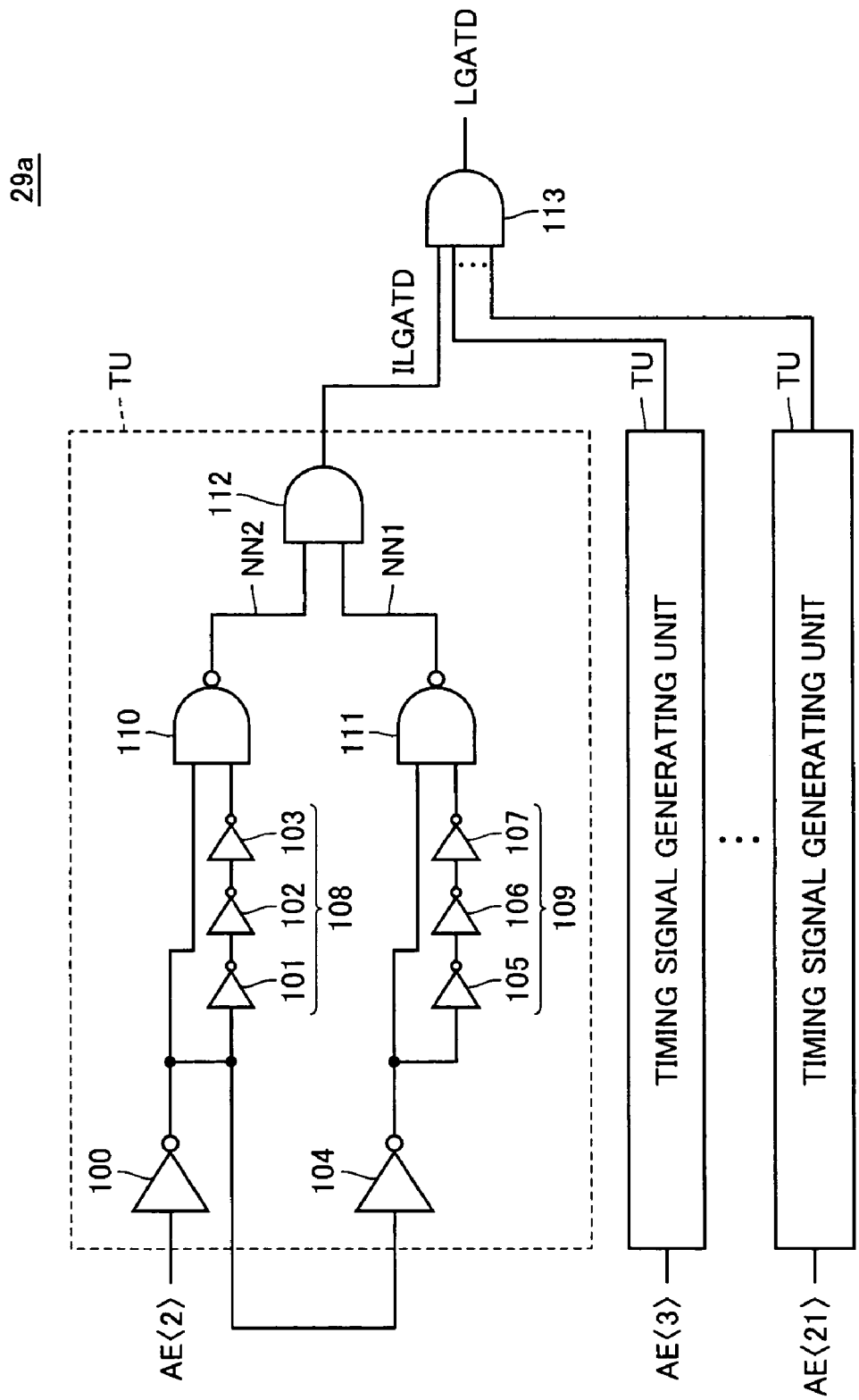
FIG. 4 is a diagram showing a circuit configuration of each signal generating circuit included in a control signal generating circuit for outputting a control signal.

Referring to FIG. 4, signal generating circuit 29a included in control signal generating circuit 29 generates a control signal LGATD ("0") in response to the input (change) of internal address AE. Signal generating circuit 29a includes a plurality of signal generating units TU corresponding to the bits of each internal address input and an AND circuit 113 supplied with an output signal from each signal generating unit TU and outputting the result of AND logic operation as control signal LGATD.

Each signal generating unit TU has the same configuration, and therefore signal generating unit TU corresponding to input internal address AE<2> will be described as a typical example.

Signal generating unit TU includes inverters 100 to 107, NAND circuits 110, 111 and an AND circuit 112. NAND circuit 110 outputs the result of NAND logic operation to AND circuit 112 based on internal address AE<2> input through inverter 100 and internal address AE<2> input through delay line 108 having inverters 100 to 103. Also, NAND circuit 111 outputs the result of NAND logic operation to AND circuit 112 based on internal address AE<2> input through inverters 100, 104 and signal AE input through inverters 100, 104 and delay line 109 including delay units 105 to 107. AND circuit 112, upon receipt of the output signals of NAND circuits 110, 111, outputs the result of AND logic operation as control signal ILGATD. A similar configuration is provided also for the other internal addresses AE<3> to AE<21>.

With reference to the timing chart of FIG. 5, the generation of control signal LGATD will be described.

In initial state, NAND circuits 110, 111 of each signal generating unit TU outputs a signal "1". The output signal of AND circuit 112 constituting the output signal of each signal generating unit TU, therefore, is set to "1", and the output signal of AND circuit 113, i.e., control signal LGATD is set to "1".

Figure 5:
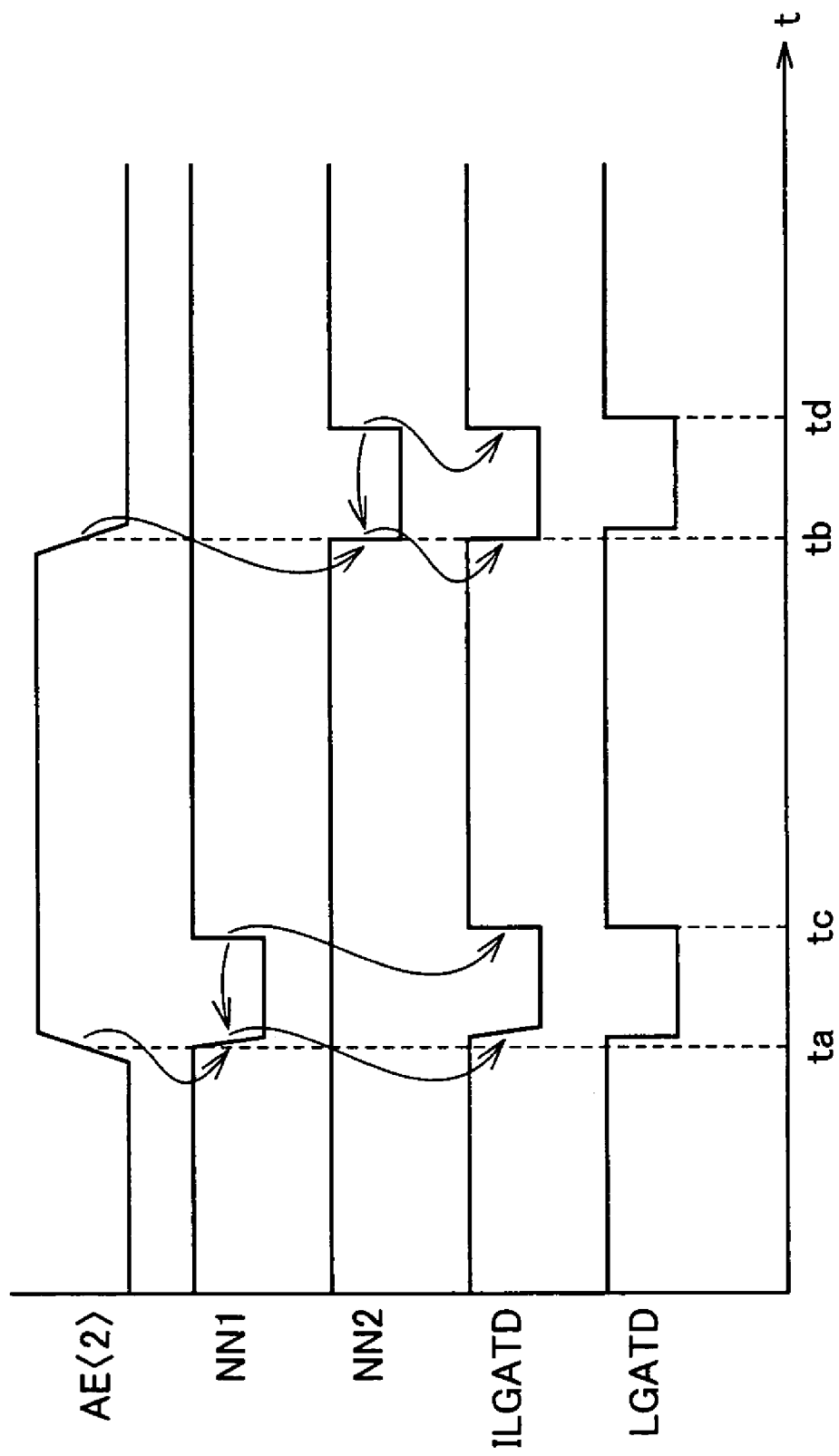
FIG. 5 is a timing chart for describing the generation of a control signal LGATD.

Referring to FIG. 5, in the case where internal address AE<2> turns from "0" to "1" at time point ta, node NN1 supplied with the output signal of NAND circuit 111 turns to "0" in signal generating unit TU. At time point tc upon the lapse of the delay time of the delay line 109, transition occurs again from "0" to "1". In response to the fact that the signal transmitted to node NN1 is set to "0", output signal ILGATD of AND circuit 112 is set to "0". During the period when output signal ILGATD remains at "0", control signal LGATD providing the output signal of AND circuit 113 is set to "0". As a result, with the change of internal address AE<2>, control signal LGATD is set to "0".

At time point tb when internal address AE<2> turns from "1" to "0", on the other hand, node NN2 supplied with the output signal of NAND circuit 110 turns "0" in signal generating unit TU. At time point td after the delay time of delay line 108, the signal turns again from "0" to "1". In response to the fact that the signal transmitted to node NN2 is set to "0", output signal ILGATD of AND circuit 112 is set to "0". During the period when output signal ILGATD remains at "0", control signal LGATD output from AND circuit 113 is set to "0". Thus, with the change in internal address AE<2>, control signal LGATD is set to "0". In this way, control signal LGATD is generated in response to the change in internal address AE.

Figure 6:
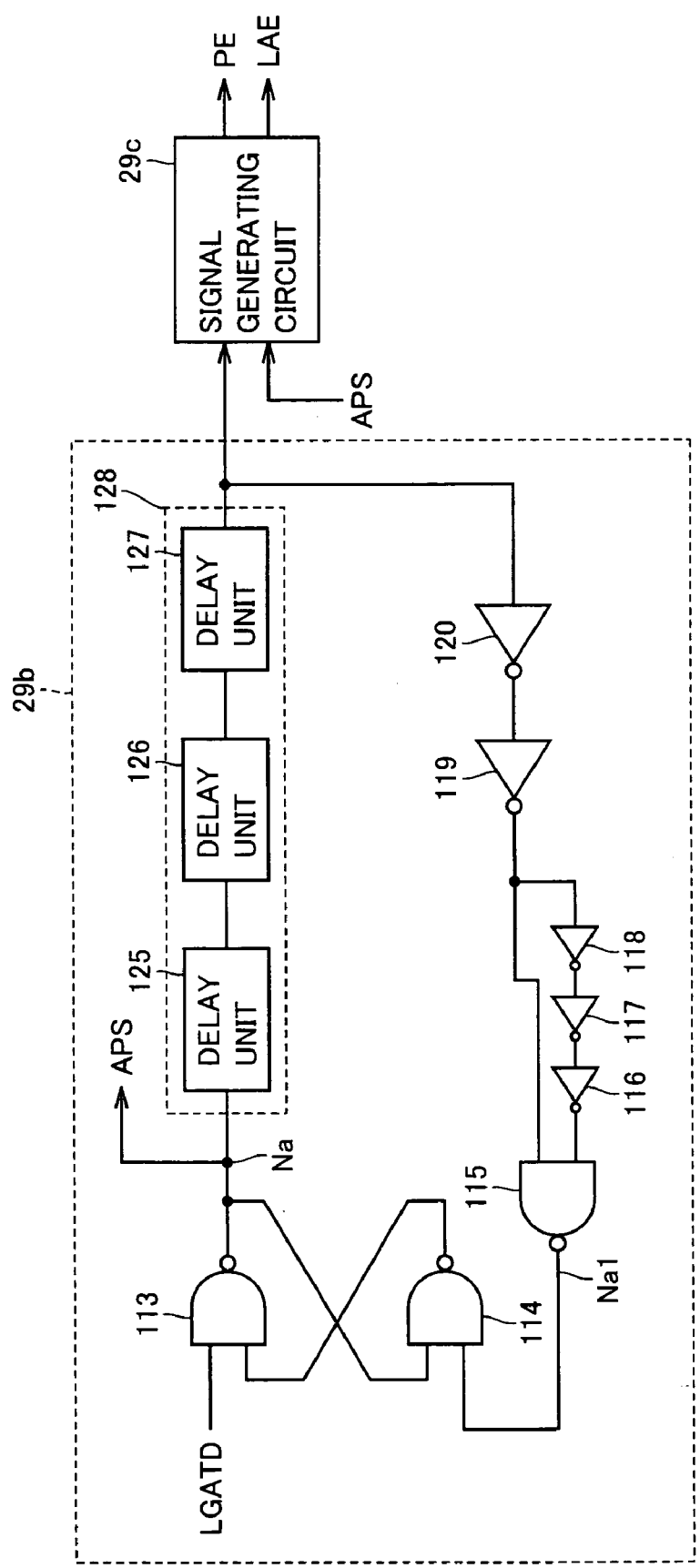
FIG. 6 is a diagram schematically showing a configuration of an APS signal generating circuit and another signal generating circuit included in the control signal generating circuit for generating control signals PE and LAE.

Referring to FIG. 6, APS signal generating circuit 29b included in control signal generating circuit 29 includes NAND circuits 113 to 115, inverters 116 to 120 and delay units 125 to 127. Delay units 125 to 127 make up a delay line 128. In this embodiment, three delay units are shown as delay line 128 as an example. Nevertheless, a plurality of delay units other than three may be included. APS signal generating circuit 29b, in response to the input of control signal LGATD, activates control signal APS for a predetermined period followed by deactivating it.

NAND circuit 113, in response to the input of control signal LGATD and the output signal of NAND circuit 114, transmits the result of NAND logic operation to node Na. Control signal APS is output from node Na. The signal transmitted to node Na is output to inverters 119, 120 through delay units 125 to 127. NAND circuit 115, in response to the output signals of series-connected inverters 119, 120 and the output signals of series-connected inverters 116 to 118, outputs the result of NAND logic operation to NAND circuit 114.

Signal generating unit 29c, in response to the input of control signal APS and control signal APS delayed through delay units 125 to 127, outputs control signal PE instructing sense amplifier band 6 to perform the precharge operation and control signal LAE instructing SA latch circuit 7 to perform the latch operation. This embodiment refers to a method in which signal generating unit 29c generates control signal PE and control signal LAE using the output signal of delay unit 127 in the last stage of delay line 128. The present invention is not limited to this configuration, however, and the output signal of delay unit 125 or delay unit 126 may alternatively be used in accordance with the specification involved.

Figure 7:
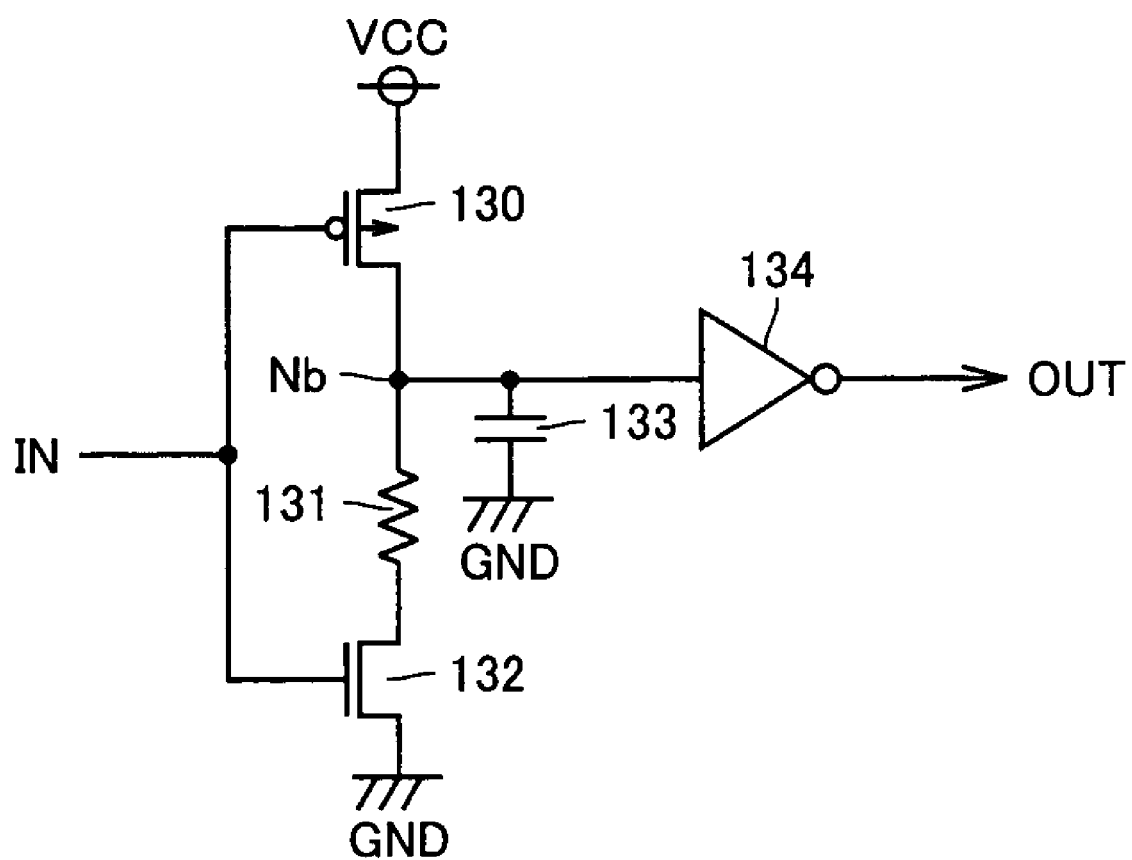
FIG. 7 is a diagram showing a circuit configuration of a delay unit.

Referring to FIG. 7, each of delay units 125 to 127 includes transistors 130, 132, a capacitor 133 and an inverter 134. Transistor 130 is arranged between power supply voltage VCC and node Nb, and has the gate thereof electrically connected to input node IN. Resistor 131 and transistor 132 are arranged between node Nb and grounding voltage GND and has the gate thereof electrically connected to input node IN. Capacitor 133 is arranged between node Nb and grounding voltage GND. Inverter 134 inverts the signal transmitted to node Nb and outputs the inverted signal to output node OUT. Capacitor 133 is used as a stabilizing capacitance.

When "1" is input to input node IN in this delay unit, for example, transistor 132 is turned on, node Nb is set to grounding voltage GND ("0"), and an inverted signal "1" is transmitted to output node OUT after the delay of a predetermined period.

With reference to the timing chart of FIG. 8, the generation of control signal APS and control signals APS, PE and LAE according to this embodiment will be described.

Figure 8:
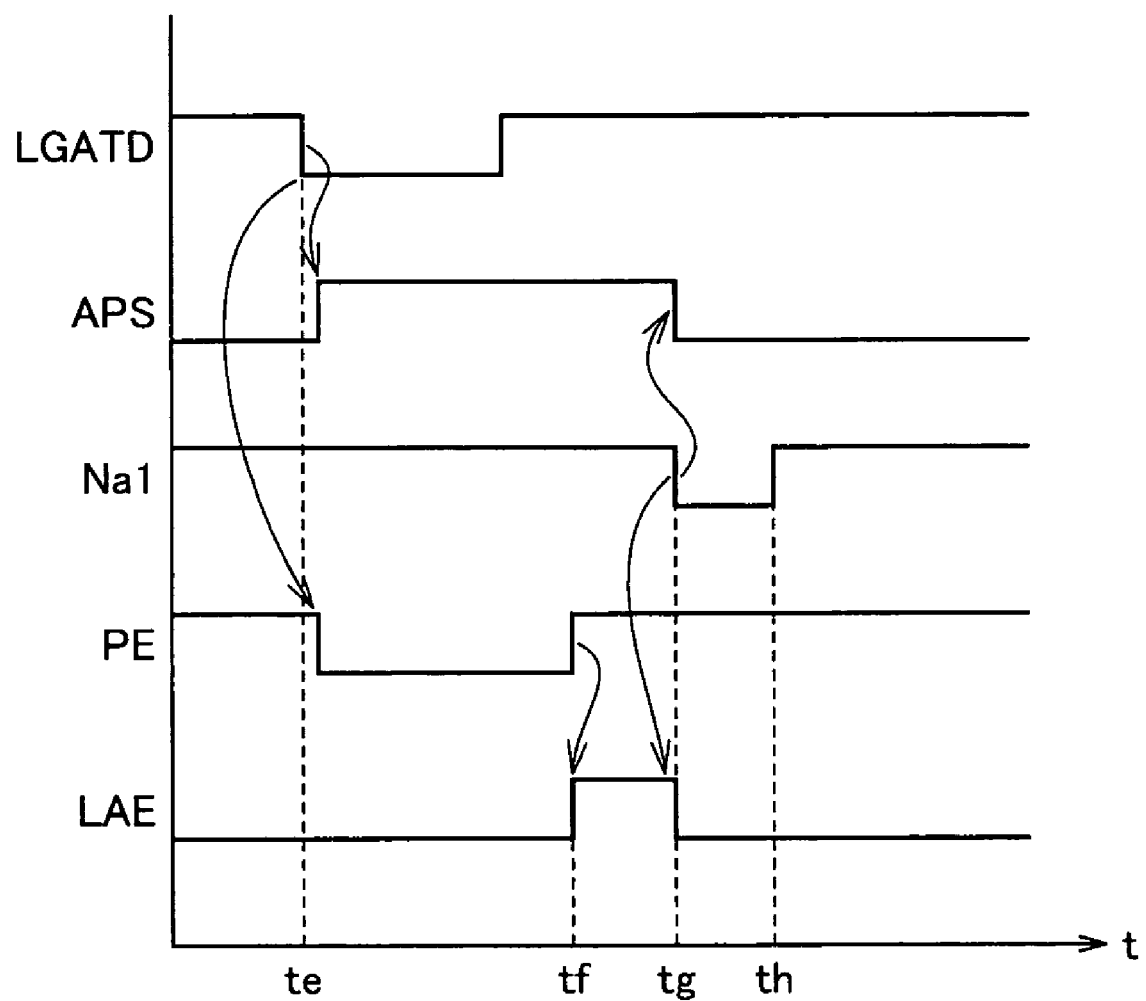
FIG. 8 is a timing chart for describing the generation of the control signals according to an embodiment.

Referring to FIG. 8, with the turning of control signal LGATD from "1" to "0" at time point te, control signal APS is output as "1" from node Na. Also, with the turning of control signal APS to "1" in signal generating unit 29c, control signal PE turns from "1" to "0", and upon the lapse of a predetermined period, turns again from "0" to "1" at time point tf With the turning of control signal PE again from "0" to "1", control signal LAE turns from "0" to "1". In APS signal generating circuit 29b, signal "1" transmitted to node Na is transmitted to the NAND circuit with a delay through delay units 125 to 127. At time point tg, output node Nal of NAND circuit 115 turns from "1" to "0". With this transition of the output node of NAND circuit 115 from "1" to "0", control signal APS turns from "1" to "0". Also, control signal LAE turns from "1" to "0" in response to the signal of node Na delayed through delay units 125 to 127.

Figure 9A:
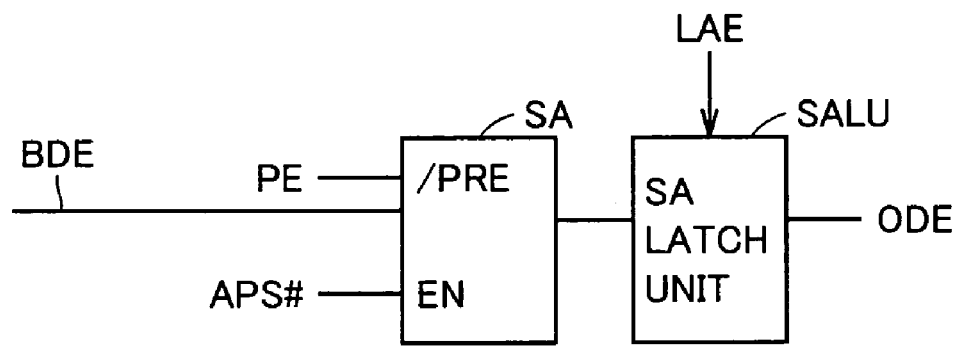
FIGS. 9A and 9B are block diagrams schematically showing a sense amplifier and a SA latch unit according to an embodiment of the present invention.

FIG. 9A shows a sense amplifier SA included in sense amplifier group SAGA and a SA latch unit SALU included in SA latch circuit 7. Incidentally, SA latch circuit 7 includes SA latch unit corresponding to the sense amplifier. In this embodiment, the configuration of the sense amplifier for amplifying a 1-bit data signal and the SA latch unit for latching the amplified data signal and outputting it as a data ODE is shown. Sense amplifier SA, in response to the input of control signal PE ("0"), executes the precharge operation of data line BDE. Also, sense amplifier SA, in response to the input of control signal APS ("1"), is activated and amplifies the data signal of data line BDE. SA latch unit SALU, in response to control signal LAE, latches the data signal from sense amplifier SA and outputs it as read data ODE.

Figure 9B:
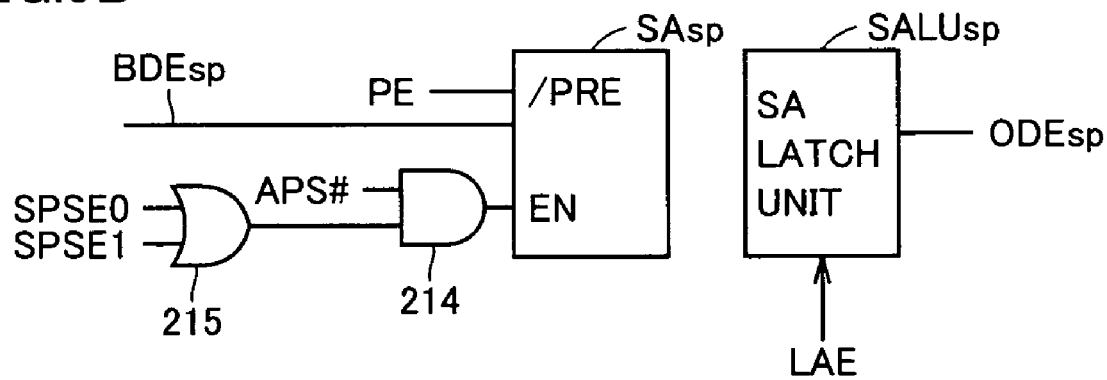

FIG. 9B shows a spare sense amplifier SAsp in spare sense amplifier group SAGC and a redundant SA latch unit SALUsp included in SA latch circuit. Spare sense amplifier SAsp, in response to the input of control signal PE, executes the precharge operation of data line BDEsp by a precharge circuit in a similar manner to the preceding case. OR circuit 215 outputs the result of OR logic operation to AND circuit 214 in response to the input of control signals SPSE0, SPSE1. Also, in response to the result of AND logic operation of AND circuit 214 supplied with control signal APS and the output signal of OR circuit 215, spare sense amplifier SAsp is activated based on the result of AND logic operation of AND circuit 214 and amplifies the data signal on data line BDEsp. The amplified signal is output as read data ODEsp. Specifically, spare sense amplifier SAsp performs the amplify operation in the case where both control signal APS and control signal SPSE0 (SPSE1) are "1". SA latch unit SALUsp, in response to control signal LAE, latches the data signal from sense amplifier SAsp and outputs it as read data ODEsp.

FIG. 10A is a diagram showing a circuit configuration of sense amplifier SA and SA latch unit SALU. Sense amplifier SA includes transistors 200, 201, 211, NOR circuits 202, 203, an inverter 210 and a constant current source 203. Transistors 201, 211 are n-channel MOS transistors, and transistor 200 is a p-channel MOS transistor.

Transistor 200 is arranged between power supply voltage VDD and node Nda, and has the gate thereof supplied with control signal PE. Transistor 201 is arranged between node Nda and data line BDE and has the gate thereof supplied with the output signal of NOR circuit 202. NOR circuit 202, supplied with the signal transmitted to data line BDE and control signal APS through inverter 210, outputs the result of NOR logic operation. Transistor 211 is arranged between data line BDE and grounding voltage GND and has the gate thereof supplied with control signal APS through inverter 210. Constant current source 209 is electrically connected to power supply voltage VDD to supply a constant current to node Nda. NOR circuit 203, supplied with the signal transmitted to node Nda and control signal APS inverted through inverter 210, outputs the result of NOR logic operation as an amplified signal to SA latch unit SALU.

SA latch unit SALU includes a transfer gate 204 and inverters 205 to 208. Transfer gate 204 passes the signal from sense amplifier SA in response to the input of control signal LAE and control signal LAE inverted through inverter 205. The signal that has passed through the transfer gate is latched in the latch circuit including inverters 206 and 207 and output as read data ODE through inverter 208.

FIG. 10B is a diagram showing a circuit configuration of redundancy sense amplifier SAsp and SA latch unit SALUsp. Sense amplifier SAsp includes transistors 200, 201, 211, NOR circuits 202, 203, an inverter 210, a constant current source 203, a NAND circuit 213, OR circuits 212, 215 and an AND circuit 214. Sense amplifier SAsp has substantially the same configuration as sense amplifier SA, although transistor 200 is supplied with the output signal of NAND circuit 213. NAND circuit 213 is supplied with the output signal of OR circuit 212 and the inverted version of control signal PE and outputs the result of NAND logic operation of the two inputs to transistor 200. OR circuit 212, in response to the input of control signals SPSE0 and SPSE1, outputs the result of OR logic operation thereof to NAND circuit 212. Specifically, spare sense amplifier SAsp carries out the precharge operation against data line BDEsp when control signal SPSE0 or SPSE1 is set to "1" and control signal PE is "1". The connection between OR circuit 215 and AND circuit 214 is similar to the one described in FIG. 9B. The output signal of AND circuit 214 is output to inverter 210. Transistors 201, 211 are n-channel MOS transistors, and transistor 200 is a p-channel MOS transistor.

Figure 11:
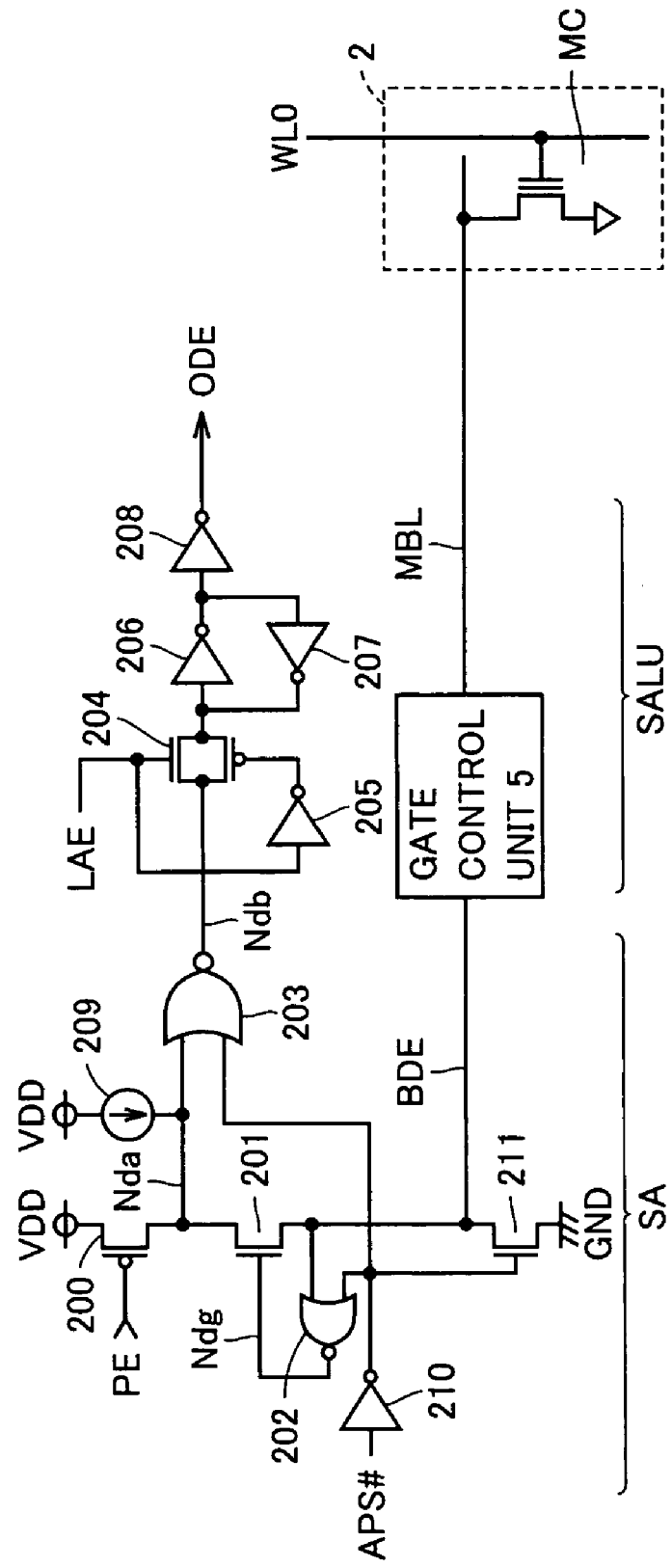
FIG. 11 is a schematic diagram for describing the data read operation according to an embodiment.

With reference to FIG. 11, the data read operation for one memory cell MC of memory array 2 is briefly described. One sense amplifier SA and a SA latch unit SALU are shown. Also, data line BDE of sense amplifier SA is electrically connected to bit line MBL through gate control unit 5. Also, memory cell MC and bit line MBL are electrically connected to each other, and the gate of memory cell MC is connected electrically to word line WL0.

With reference to the timing chart in FIG. 12, the data read operation according to an embodiment of the present invention will be described.

Figure 12:
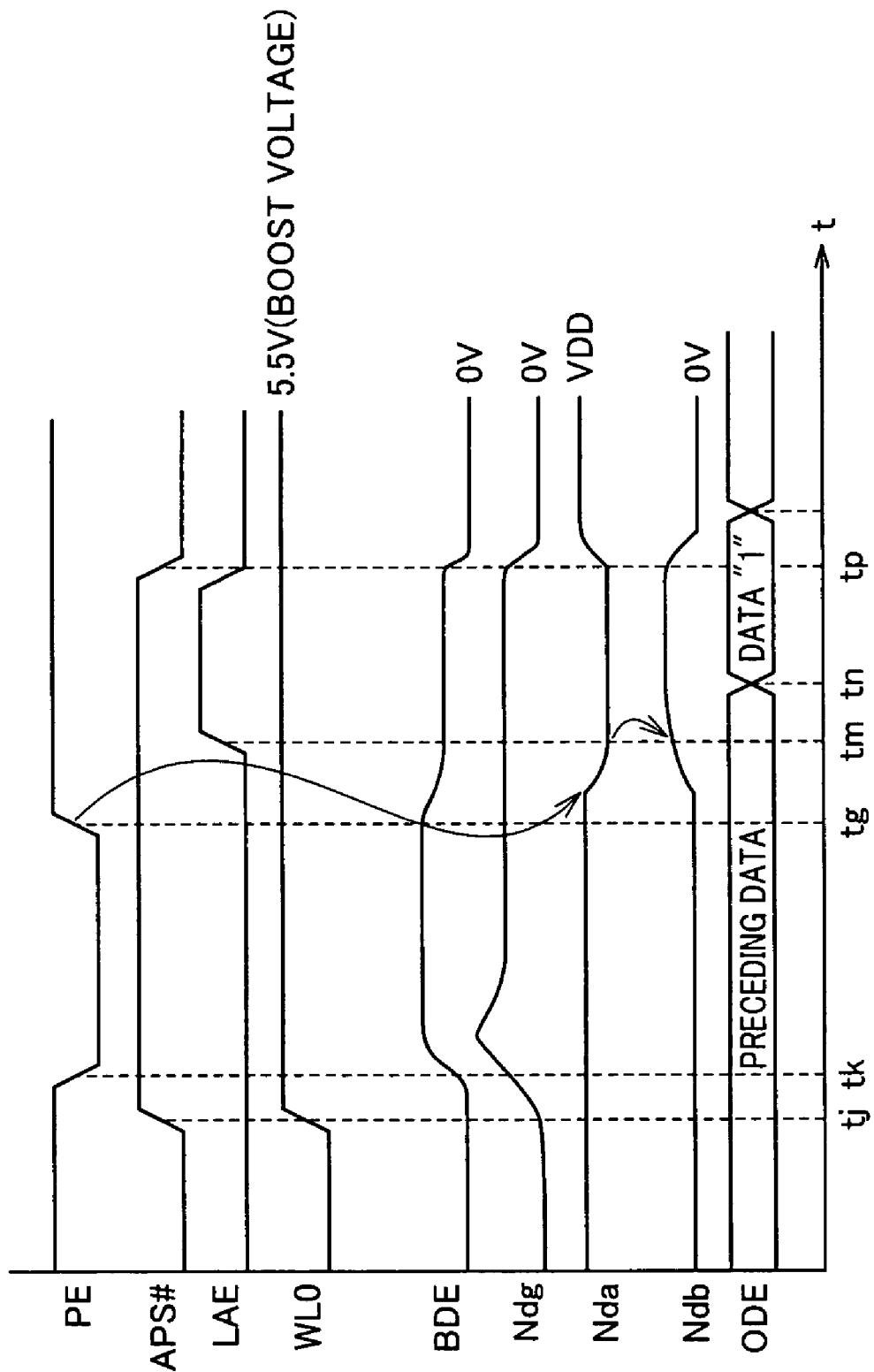
FIG. 12 is a timing chart for describing the data read operation according to an embodiment.

Referring to FIG. 12, in response to the input of internal address AE not shown, control signal LGATD is generated in control signal generating circuit 29 as described above, and control signal APS turns from "0" to "1" at time point tj. Also, at substantially the same timing, word line WL0 is selected, and memory cell MC and bit line MBL are electrically connected to each other. In this case, a boost voltage of 5.5 V is impressed. Though described later, at the time of reading data, the row select operation of word line WL0 is carried out while at the same time the column select operation is performed by gate control unit 5, so that data line BDE and bit line MBL are electrically connected to each other.

At time point tk, as described above, control signal PE is set to "0" in signal generating unit 29c, and the precharge operation of data line BDE is executed. Specifically, transistor 200 is turned on, power supply voltage VDD and node Nda are electrically connected to each other, and the voltage level of data line BDE rises from 0 V through transistor 201. With the rise of the voltage level of data line BDE, NOR circuit 202 reduces the voltage level of gate node Ndg of transistor 201 and turns off transistor 201. As a result, data line BDE is precharged to a predetermined voltage.

At time point tg when control signal PE turns from "0" to "1" again, the precharge operation is ended, and transistor 200 is turned off. Thus, only constant current source 209 is electrically connected to node Nda. Constant current Iref flowing from constant current source 209 is set to a value smaller than cell current Icell (≧Iref) passing through the memory cell which is in extinguished state, i.e., unprogrammed state. In this embodiment, for example, in the case where memory cell MC selected by word line WL0 is in unprogrammed state, data line BDE and selected memory MC are electrically connected to each other, thereby trying to supply cell current Icell. As a result, the predetermined voltage precharged to data line BDE is gradually reduced. At the same time, current is supplied from constant current source 209 through transistor 201, so that the potential of node Nda drops. In response to this, the potential level of output node Ndb of NOR circuit 203 rises gradually from 0 V. At time point tm when the potential level is settled, control signal LAE is set to "1" and the data is retrieved into SA latch unit SALU. In the case under consideration, data "1" is retrieved by SA latch unit SALU, and at time point tn, output as read data ODE ("1").

Next, with the turning of control signal APS from "1" to "0" at time point tp, control signal LAE is set to "0", and the potential level of each node is set to initial state thereby to complete the data read operation.

Figure 13:
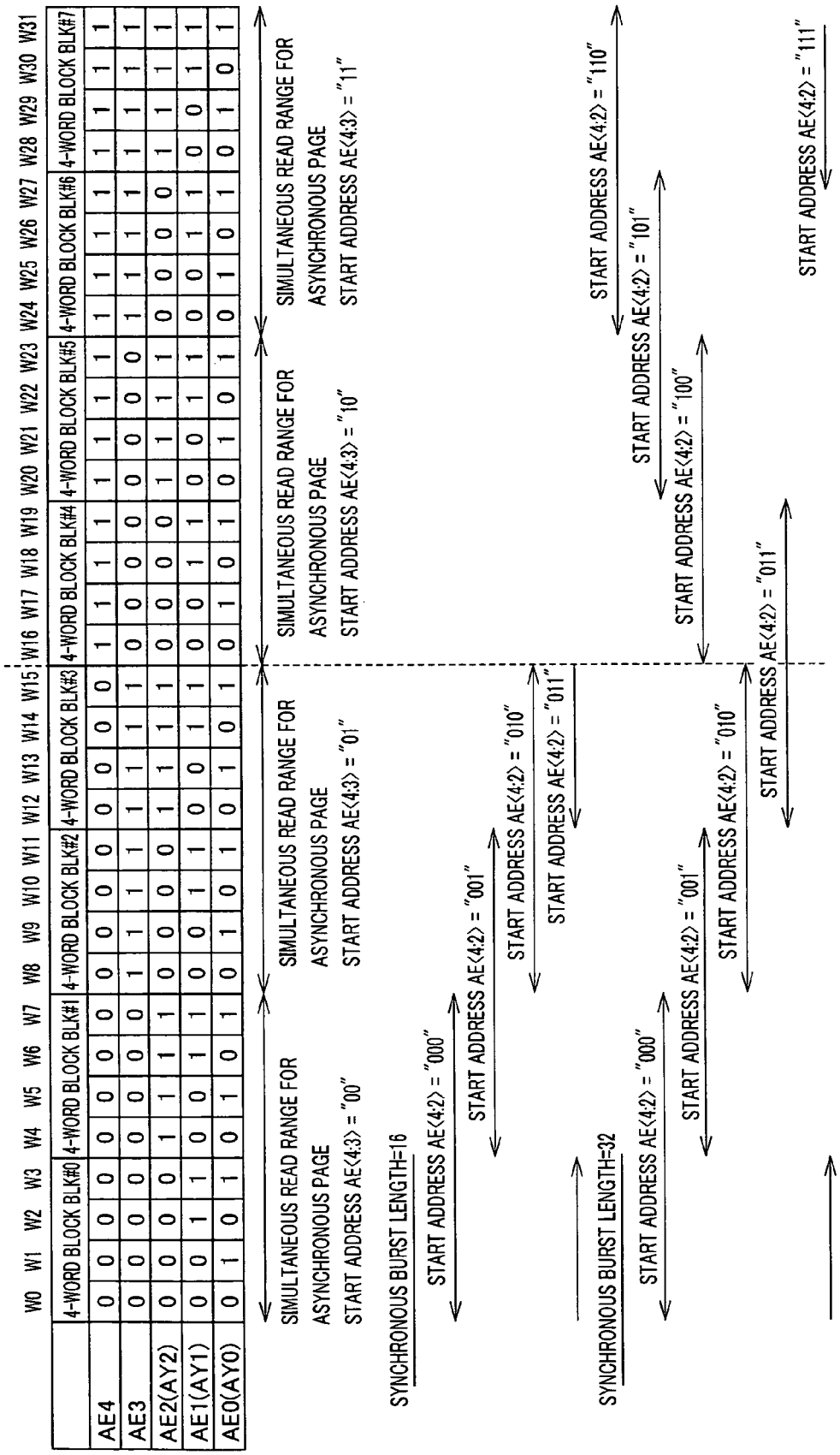
FIG. 13 is a diagram for describing the relation between the work blocks read in parallel in burst mode and the related internal addresses AE according to an embodiment.

In FIG. 13, 32 words W0 to W31 correspond to each internal address AE<4:0> and are divided into blocks of four words. Specifically, words W0 to W3 correspond to block BLK#0, and words W4 to W7 to 4-word block BLK#1. Also, words W8 to W11 correspond to 4-word block BLK#2, and words W12 to W15 to 4-word block BLK#3. Further, words W16 to W19 correspond to 4-word block BLK#4, and words W20 to W23 to 4-word block BLK#5. Words W24 to W27 correspond to 4-word block BLK#6, and words W28 to W31 to 4-word block BLK#7.

The data read operation according to this embodiment is carried out by reading eight words in parallel (at the same time) as described above.

For the simultaneous read operation of an asynchronous page in the case where internal address AE<4:3> of the start address is the more significant bits "00", for example, 4-word blocks BLK#0, BLK#1 are read at the same time. Also, in the case where the internal address AE<4:3> of the start address is the more significant bits "01", 4-word blocks BLK#2, BLK#3 are read at the same time. In the case where internal address AE<4:3> of the start address is the more significant bits "10", 4-word blocks BLK#4, BLK#5 are read at the same time. Similarly, in the case where internal address AE<4:3> of the start address is the more significant bits "11", 4-word blocks BLK#6, BLK#7 are read at the same time.

Now, the data read operation with the synchronous burst length of 16 according to the method of present invention will be described.

In the case where internal address AE<4:2> of the start address is the more significant bits "000", 4-word blocks BLK#0, BLK#1 are read at the same time. In the case where internal address AE<4:2> of the start address is the more significant bits "001", on the other hand, 4-word blocks BLK#1, BLK#2 are read at the same time. In the case where internal address AE<4:2> of the start address is the more significant bits "010", 4-word blocks BLK#2, BLK#3 are read at the same time. Similarly, in the case where internal address AE<4:2> of the start address is the more significant bits "011", 4-word blocks BLK#3, BLK#4 are read at the same time. In the case where the synchronous burst length is 16, 4-word blocks BLK#0 to #3 and/or 4-word blocks BLK#4 to #7 correspond to the burst area for carrying out the burst read operation. In the case where the synchronous burst length is 16, the more significant bits to be incremented are internal address AE<3>. Specifically, internal address AE<4> is fixed, while only internal address AE<3> is incremented to carry out the burst read operation.

The data read operation for the synchronous burst length of 32 according to the method of the present invention will be described below.

In the case where internal address AE<4:2> of the start address is the more significant bits "000", 4-word blocks BLK#0, BLK#1 are read at the same time. In the case where internal address AE<4:2> of the start address is the more significant bits "001", on the other hand, 4-word blocks BLK#1, BLK#2 are read at the same time. In the case where internal address AE<4:2> of the start address is the more significant bits "010", 4-word blocks BLK#2, BLK#3 are read at the same time. Similarly, in the case where internal address AE<4:2> of the start address is the more significant bits "011", 4-word blocks BLK#3, BLK#4 are read at the same time. In the case where internal address AE<4:2> of the start address is the more significant bits "100", 4-word blocks BLK#4, BLK#5 are read at the same time. In the case where internal address AE<4:2> of the start address is the more significant bits "101", on the other hand, 4-word blocks BLK#5, BLK#6 are read at the same time. In the case where internal address AE<4:2> of the start address is the more significant bits "110", 4-word blocks BLK#6, BLK#7 are read at the same time. Similarly, in the case where internal address AE<4:2> of the start address is the more significant bits "111", 4-word blocks BLK#7, BLK#0 are read at the same time.

Specifically, in the reading method according to an embodiment of the present invention, in the case where internal address AE<4:2> included in the start address designates a predetermined 4-word block BLK#, the 4-word block BLK# next to be selected is read at the same time by the burst operation. According to this method, the 4-word block BLK# next to be selected is read at the same time by one address input, and therefore at least the time required to read each word W of the 4-word block BLK# next to be selected is secured. In this way, the access operation including the address processing and the select operation for the next address input can be carried out during the particular time. Thus, the problem of the lack of time margin which may be posed when the start address is to carry out the read operation of one page is solved. As a result, without increasing the chip area or power consumption, the data can be output continuously without fail. In other words, the access time in burst mode is improved.

Now, the circuit configuration for implementing this method will be described.

In this configuration, memory mats MATA, MATB correspond to internal address AE2 to carry out the parallel burst read operation. This internal address AE2 represents the more significant bit of internal address AE<2:0> incremented by burst counter 23B. In this case, internal address AE2 of "0" and "1" correspond to memory mats MATA, MATB, respectively.

With reference to FIG. 14A, description will be given of column decoder CDCA0 for executing the address conversion process to carry out the burst method described above with reference to FIG. 13.

The address conversion process is described. As shown in FIG. 13, in the case where the word W designated by the start address is included in the 4-word block corresponding to the even numbers such as 4-word blocks BLK#0, BLK#2 and so on, i.e., in the case where internal address AE2 is "0", two 4-word block BLK# similar to the simultaneous reading range on the asynchronous page are read.

In the case where the word W designated by the start address is included in the 4-word block BLK# corresponding to odd numbers such as 4-word blocks BLK#1, BLK#3 and so on, i.e., in the case where internal address AE2 is "1", on the other hand, internal address AE<4:3> is required to be converted to read the next 4-word block BLK#. In the case where the synchronous burst length is 16, internal address AE3 is required to be incremented to convert to the address designating the next 4-word block BLK#. In the case where the synchronous burst length is 32, on the other hand, internal address AE<4:3> is required to be incremented to convert to the address designating the next 4-word block BLK#. In other words, in the case where the word W designated by the start address is stored in memory MATB corresponding to internal address AE2 of "1", internal address AE<4:3> is incremented.

Column decoder CDCA0 includes an address conversion circuit for executing this conversion process, and an address conversion circuit is configured of AND circuits AD0, AD1 and exclusive OR circuits ER0, ER1.

Specifically, AND circuit AD0, based on the input of control signal BST32 defining the synchronous burst length of 32 and internal addresses AE<2>, AE<3>, outputs the result of AND logic operation thereof to exclusive OR circuit ER0. Exclusive OR circuit ER0, based on internal address AE<4> and the output signal of AND circuit AD0, executes the exclusive OR logic operation and outputs internal address AEA<4>. Also, inverter Ia outputs internal address /AEA<4> in response to internal address AEA<4>.

AND circuit AD1, based on the input of control signal BST16 defining the synchronous burst length of 16 and 32 and internal address AE<2>, outputs the result of AND logic operation thereof to exclusive OR circuit ER1. Exclusive OR circuit ER1, based on the input of internal address AE<3> and the output signal of AND circuit AD1, executes the exclusive OR logic operation thereof and outputs internal address AEA<3>. Also, inverter Ib outputs internal address /AEA<3> in response to internal address AEA<3>. Incidentally, internal address AEA<4:3> corresponds to the address conversion signal for incrementing internal address AE<4:3>.

In the case where the synchronous burst length is 16, i.e., in the case where control signal BST16 is set to "1", internal address AEA<3> is output as "1" by the address conversion circuit when internal address AE<3:2> of the start address is "01".

In the case where the synchronous burst length is 32, i.e., in the case where control signals BST16, BST32 are set to "1", on the other hand, internal address AEA<4:3> is output as the more significant bits "10" by the address conversion circuit when internal address AE<4:2> of the start address is "011".

In the case where internal address AE2 is not "0", on the other hand, internal address AE<4:3> is output as internal address AEA<4:3> without being converted. Also, in the case where the synchronous burst length is neither 16 nor 32, or in the case where the synchronous burst length is 8, for example, control signals BST16, BST32 are set to "0", and therefore internal address AE<4:3> is output as internal address AEA<4:3> without being converted. The explanation of this example concerns a case in which the synchronous burst length is larger than the number (8) of words W of which parallel read operation is executed.

Internal addresses AEA<3> and AEA<4> thus converted are predecoded through AND circuits AD2 to AD5, and output as control signal ICALA<3:0>. Control signal ICALA<3:0> thus generated is output as control signals CALA<0> to CALA<3> through driver circuits DV2 to DV5 making up a column drive circuit 4.

Based on this control signal CALA<3:0>, one of four bit lines MBL is selected in column select gate CASG of each subgate control unit SIO.

Control signal CAUE is generated as a signal corresponding to bank select signal BPi. In the case where bank select signal BP0 is input, for example, control signal CAUE0 is generated through drivers DV0, DV1 making up column driver circuit 4 in response to bank select signal BP0.

Based on this control signal CAUE0, one of four bit lines MBL selected in column select gate CASG of each subgate control unit SIO and a corresponding data line BDE are electrically connected to each other.

NAND circuit ND0, supplied with control signal CALA<3:0> and control signal /RSTa11, generates control signal BRSTA<3:0> as the result of NAND logic operation. Specifically, under normal conditions, control signal /RSTa11 is set to "1", and control signal BRSTA<3:0> is generated as an inverted version of input control signal CALA<3:0>. In the case where control signal CALA<3:0> is "1000", for example, control signal BRSTA<3:0> is set to "0111". All bit lines MBL other than the four bit lines MBL selected by column select gate CASG of each subgate control unit SIO are electrically connected to grounding voltage GND by the turning on of a transistor.

In this configuration, bit lines MBL other than the bit lines MBL selected by column select gate CASG of each subgate control unit SIO are electrically connected to grounding voltage GND, and therefore the function as a shield line is exhibited. Stable read operation can be thus performed without receiving the coupling noises from other bit lines MBL. Also, once control signal RSTa11 is set to "0", control signal BRSTA<3:0> are all set to "1111", and therefore all bit lines MBL are reset and electrically connected to grounding voltage GND.

Referring to FIG. 14B, column decoder CDCA1 has no address conversion circuit, and based on the input of internal address AE<4:3>, control signal CALB<3:0>, control signal CAUE and control signal BRSTB<3:0> are generated. Specifically, as in the aforementioned case, input internal address AE<4:3> is predecoded through AND circuits AD6 to AD9 and output as control signal ICALB<3:0>. Control signal ICALB<3:0> thus generated is output as control signals CALB<0> to CALB<3> through driver circuits DV10 to DV13 making up column driver circuit 4.

With regard to control signal BRSTB<3:0>, as described above for NAND circuit ND2, control signal CALB<3:0> and control signal /RSTa11 are input, and control signal BRSTB<3:0> is generated as an inverted version of control signal CALB<3:0>. Incidentally, control signal /RSTa11 is normally set to "1" normally. By setting control signal /RSTa11 to "0", however, all bit lines MBL are reset by a similar operation to the aforementioned case.

Referring to FIG. 14C, spare column decoder CDCA2 generates control signal CALsp based on redundancy select signal SPSE0 input through drivers DV6, DV7. Also, NAND circuit ND2 generates control signal BRSTsp based on the input of control signal CALsp and control signal /RSTa11.

Referring to FIG. 15, description will be given of the case where the data read operation is carried out in accordance with this method employing the burst mode. Reference is made to a case in which of all address ADD<22:00> input from an external source as a valid address, address ADD<4:0> represents the more significant bits "00110".

At time point T0a, control signal ADV ("0") is input. Address latch circuit 30 retrieves address ADD input through address buffer 31 in response to an instruction from address latch control circuit 22 at the timing when control signal ADV rises to "1" or internal clock CLK turns from "0" to "1". According to this embodiment, address ADD is shown to be retrieved at time point T0*b* when internal clock CLK rises to "1". Also, burst control circuit 23 is supplied with internal address IA<22:0> from address buffer 31, and subsequently, the internal address is output by being incremented in address latch circuit 30 from burst control circuit 23. At time point T0, internal address AE is transmitted from address latch circuit 30.

At the same time, based on internal address AE<21:13>, as described above, block BU is selected, and based on internal address AE<12:5>, the row select operation for block BU is carried out thereby to select word line WL.

Also, in response to the input of this internal address, control signal generating circuit 29 sets control signal PE to "0". Then, in response to the input of control signal PE ("0"), the precharge operation is performed in sense amplifier band 6, as described above, in preparation for the data read operation. At time point T1, control signal PE is set to "1" and the precharge operation is ended, followed by starting the data read operation.

In this case, internal address AE<4:2> is "001", and based on this, the column select operation is carried out. Specifically, since internal address AE<4:2> is "001", the address is converted in column decoder CDCB0, so that internal address AEA<3> is converted to "1". At the same time, in memory mat MATA with internal address AE2 corresponding to "0", control signal CALA<3:0> is set to "0010", so that the word with internal address AE<4:3> corresponding to "01" is read. Specifically, 4-word block BLK#2 is read. In other words, words W8 to W11 are read. In memory mat MATB with internal address AE2 corresponding to "1", on the other hand, control signal CALB<3:0> is set to "0001", and the word with internal address AE<4:3> corresponding to "00" is read. Specifically, 4-word block BLK# 1 is read. In this way, words W4 to W7 area read.

As a result, as described above, in the case where internal address AE2 of the start address is "1", the next 4-word block BLK#2 can be read in parallel.

At the next time point T2, as described above, with the transition of control signal PE from "0" to "1", control signal generating circuit 29 sets control signal LAE to "1". Then, the data amplified in sense amplifier band 6 is latched in SA latch circuit 7. At the next time point T3, control signal ZODE is set to "1", and read data ODE latched in SA latch circuit 7 is retrieved by latch circuit 8. Control signal ZODE thus set to "0" is latched and output to selector 9. Selector 9, based on the input of internal address AY<2:0> input at similar timing, outputs words W one by one by ⅛ selection of read data ODE<127:0>. In this embodiment, since internal address AY<2:0> providing the first start address is "110", the word W6 is selected first by selector 9 among words W4 to W11 that have been read, and output as read data RDE<15:0>.

Subsequently, in synchronism with the rise of clock CLK, internal address AY<2:0> is incremented by burst counter 23B, so that words W are sequentially and continuously output. Specifically, words W including words W7, W8, . . . , W11 are output in ascending order continuously. Each of words W4 to W11 is selected by selector 9 based on internal address AY incremented for each clock cycle of clock CLK, and therefore words W4 to W11 are dividedly read for each clock cycle.

Incidentally, words W4 to W5 precede to word W6 and therefore are not output. At time point T5, output data DQ<15:0> is output at data terminal 15 through data swap circuit 10, latch circuit 12 and output buffers 13, 14. Specifically, selector 9, data swap circuit 10, latch circuit 12 and output buffers 13, 14 make up a data output circuit operating in synchronism with clock CLK, whereby each 16-bit read data are sequentially transmitted to data terminal 15 by pipelining.

After word W11 of 4-word block BLK#2 is read, the burst read operation is executed continuously also for words W12 and subsequent words.

In this configuration, internal address AY<2:0> providing the start address is "110", and therefore the read operation period is available for words W6 to W11. During the 6-clock period when words W6 to W11 are output after the first start address, therefore, the data read operation including a predetermined address processing is carried out in accordance with the next internal address LAE. Specifically, burst control circuit 23 operates in such a manner that burst counter 23B outputs internal address IAE<4:2> in the form of "011" to address latch circuit 30. Based on this, the column select operation and the row select operation similar to the corresponding ones of the aforementioned case are executed. In this way, based on internal address AE<4:3>, control signals CALA, CALB are selected, respectively.

In this case, since internal address AE<4:2> is "011", 4-word blocks BLK#3, BLK#0 are selected and read at the same time. Control signal ZODE rises to latch the word W of the next two 4-word blocks BLK#3, BLK#1 at time point T8 6 clocks later than time point T4 when control signal ZODE has first risen, and words W12 to W15 and words W0 to W3 are output in ascending order. At the same time, burst counter 23B, after selecting word W11, sets internal address AY<2:0> to "100" to select word W12, and performs the burst operation continuously from word W12 of 4-word block BLK#3.

Then, as in the case described above, during the period before W3 of block BLK#0 is selected, internal address AE<4:2> is set to "001", and corresponding 4-word blocks BLK#1, BLK#2 are read at the same time. Thus, control signal ZODE rises to latch the next two 4-word blocks eight clocks after time point T8. As a result, the data read operation of synchronous burst length 16 can be carried out.

In the case where the synchronous burst length is 32, the data read operation can be carried out in a similar way to the case where the synchronous burst length is 16. Incidentally, in the case where the synchronous burst length is 32, control signals BST16 and BST12 are both set to "1".

Specifically, according to this method, as described above, the word corresponding to the next word block BLK# is read at the same time that the start address is set. Therefore, the subsequent period of outputting 4-word block BK#, i.e., the 4-clock period can be positively secured to decode the internal address. In other words, the access time in burst mode can be improved. Also, in this configuration, 8 words of 128 sense amplifiers are read in parallel, and therefore the burst mode is executed without increasing the chip area and power consumption.

Although this embodiment refers to the synchronous mode, the asynchronous mode can alternatively be employed. Specifically, by fixing the signal "1" for controlling the latch operation of the latch circuit, the read operation in asynchronous mode can be carried out. In this way, by setting control signals LAE, ZODE and clock CLKQ# to "1", the read data can be output to external terminal 15 without being latched by pipelining in the latch circuit. Incidentally, the asynchronous mode is typical one of other normal operation modes.

In this configuration, the address conversion circuit for the internal address used for the column select operation will be described. Nevertheless, the present invention is not limited to this operation of the address conversion circuit, but the same address conversion circuit is applicable also the row select operation.

SECOND EMBODIMENT

The second embodiment refers to a redundant configuration in the memory array described with reference to the first embodiment.

Figure 16:
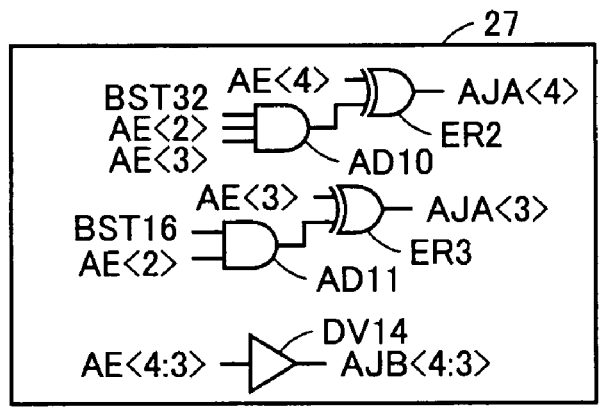
FIG. 16 is a diagram showing a circuit configuration of a redundant address buffer.

Referring to FIG. 16, the address conversion similar to the one employed for the column decoder CDCA0 is required for this redundant address buffer 27.

The address conversion for redundancy determination is carried out based on the input of internal address AE<4:2>. Specifically, AND circuit AD10, exclusive OR circuits ER2, ER3 make up an address conversion circuit. The operation is similar to the one described above for column decoder CDCA0. In the case where internal address AE2 is "1", the address is converted and internal address AJA<4:3> is generated. In the case where internal address AE2 is "0", on the other hand, AJB<4:3> is generated. Specifically, internal addresses AJA and AJB for determination are generated for memory mat MATA with internal address AE2 of "0" and memory mat MATB with internal address AE2 of "1", respectively.

Figure 17:
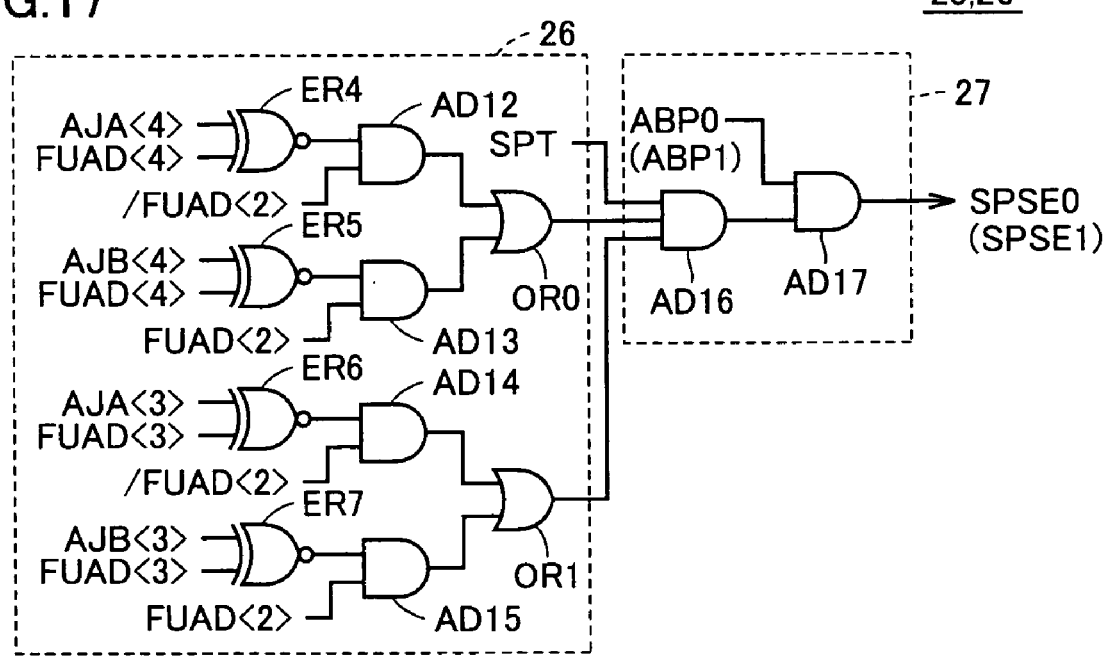
FIG. 17 is a diagram showing a circuit configuration of a fuse determining unit and a signal generating unit.

Referring to FIG. 17, fuse determination unit 26 compares input internal address AJA<4:3> with programmed fuse address FUAD<4:3>. Also, internal address AJB<4:3> and programmed fuse address FUAD<4:3> are compared with each other. This determination is made in accordance with whether the address of 4-word block BLK# read by internal address <4:0> using the more significant two bits and the address of 4-word block BLK# including the words replaced using a preprogrammed redundant data signal are coincident with each other or not.

Specifically, fuse determination unit 26 includes logic circuits ER4 to ER7 for carrying out exclusive NOR operation, AND circuits AD12 to AD15 and OR circuits OR0 to OR1.

In logic circuits ER4, ER5, fuse address AD<4> is compared with internal addresses AJA<4> and AJB<4>, respectively, and the output signals constituting determination signals are output to AND circuits AD12 and AD13, respectively. In logic circuits ER6, ER7, on the other hand, fuse address FUAD<3> is compared with internal addresses AJA<3> and AJB<3>, respectively, and the output signals constituting determination signals are output to AND circuits AD14 and AD15, respectively.

AND circuit AD 12, in response to the input of the output signal from logic circuit ER4 and the inverted signal /FUAD<2> of fuse address FUAD<2>, outputs the result of AND logic operation thereof to OR circuit OR0. AND circuit AD 13, on the other hand, in response to the input of the output signal from logic circuit ER5 and fuse address FUAD<2>, outputs the result of AND logic operation to OR circuit OR0. AND circuits AD12, AD13 determine for which internal address, AJA or AJB, the redundancy determining operation is executed. In the case where fuse address FUAD<2> stored in advance is "0", for example, the redundancy determining operation is performed for internal address AJA corresponding to memory mat MATA with fuse address /FUAD<2> of "1", while in the case where fuse address FUAD<2> stored in advance is "1", on the other hand, the redundancy determining operation is performed for internal address AJB corresponding to memory mat MATB.

In a similar manner, AND circuit AD 14, in response to the input of the output signal of logic circuit ER6 and the inverted signal /FUAD<2> of fuse address FUAD<2>, outputs the result of AND logic operation thereof to OR circuit OR1. AND circuit AD15, in response to the output signal of logic circuit ER7 and the output signal of fuse address FUAD<2>, outputs the result of AND logic operation thereof to OR circuit OR1.

OR circuit OR0, in response to the input of the output signals of AND circuits AD12, AD13, outputs the result of OR logic operation thereof to AND circuit AD16. OR circuit OR1, on the other hand, in response to the output signals of AND circuits AD14, 15, outputs the result of AND logic operation to AND circuit AD16.

Signal generating unit 25 operates in such a manner that in the case where internal address AJA<4:3> is coincident with fuse address FUAD<4:3>, for example, "1" signal is output from OR circuits OR0, OR1, respectively, and in response to the input of control signal SPT ("1"), AND circuit AD16 outputs "1" to AND circuit AD 17.

AND circuit AD 17, in response to the input of one of bank select signals BP0, BP1, and the output signal of AND circuit AD16 outputs the result of AND logic operation as control signal SPSE0 (SPSE1). Specifically, signal generating circuit 25, based on control signal SPT and bank select signal BP<1:0> input thereto in response to the determination signal from the fuse determination unit, outputs control signal SPSE<1:0>. In the case where control signal SPSE0 is "1", the redundancy select operation on bank BA0 is executed. In the case where control signal SPSE1 is "1", on the other hand, the redundancy determining operation for one of memory mats MATA, MATB on bank BA1 is executed.

Fuse determination unit 26, therefore, determines using logic circuits ER4, ER6 whether internal address AJA<4:3> is coincident with fuse address FUAD<4:3> or not, on the one hand, and determines using logic circuits ER5, ER7 whether internal address AJB<4:3> is coincident with fuse address FUAD<4:3> or not, on the other hand. Specifically, fuse determination unit 26 determines whether word W required to be replaced with redundant data information is contained in 4-word block BLK# read based on internal address AE<4:3> or not. In the case where 4-word block BLK# is read, control signal SPSE0 is set to "1", and control signal CALsp in spare column decoder CDCA2 is set to "1". At the same time, the column select operation is executed and the redundant data is transmitted to the data line BDEsp from the redundant memory mat SMAT0, sensed and amplified by spare sense amplifier SAGC, and in response to control signal LAE, transmitted to and latched by SA latch circuit 7, while at the same time being latched by spare latch circuit 8# in response to control signal ZODE.

Figure 18:
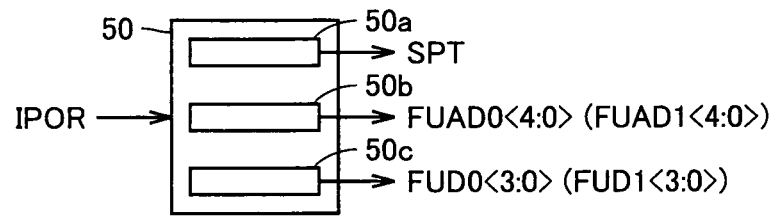
FIG. 18 is a diagram schematically showing the structure of a fuse program.

Referring to FIG. 18, fuse program unit 50 shown in FIG. 1 includes a SPT program unit 50a for outputting control signal SPT in response to the input of control signal IPOR, a fuse address unit 50b for outputting a fuse address FUAD0<4:0>, and a fuse bit unit 50c for outputting a fuse bit data FUD0<3:0> for selecting the bit to be replaced. Although this embodiment refers to bank BA0, as shown in parentheses, an address unit and a fuse bit unit for storing fuse address FUAD1<4:0> and a fuse bit data FUD1<3:0> are arranged in positions corresponding to bank BA1.

Figure 19A:
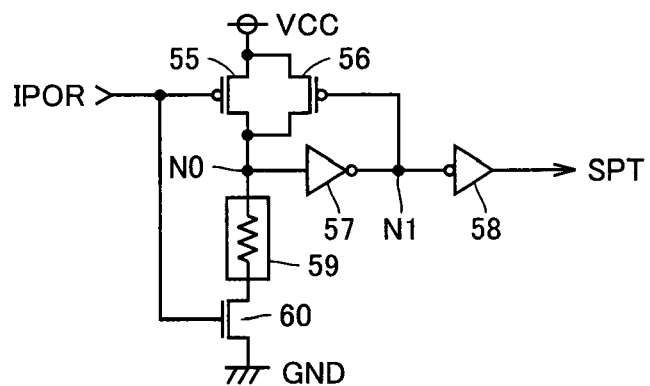
FIGS. 19A to 19C are diagrams showing a circuit configuration of a SPT signal generating unit, a fuse address unit and a fuse bit unit, respectively.

FIG. 19A shows a circuit for generating control signal SPT according to this embodiment.

SPT signal generating unit 50a includes transistors 55, 56, inverters 57, 58, a fuse element 59 and a transistor 60.

Transistor 55 is arranged between power supply voltage VCC and node N0, and has the gate thereof supplied with control signal IPOR. Transistor 56 is arranged between power supply voltage VCC and node N0 in parallel to transistor 55, and has the gate thereof electrically connected to node N1. Inverter 57 inverts the signal transmitted to node N0 and outputs it to node N1. Inverter 58 inverts the signal transmitted to node N1 and outputs a control signal SPT. Fuse element 59 is arranged between node N0 and grounding voltage GND, and the gate of transistor 60 is supplied with control signal IPOR.

Figure 20:
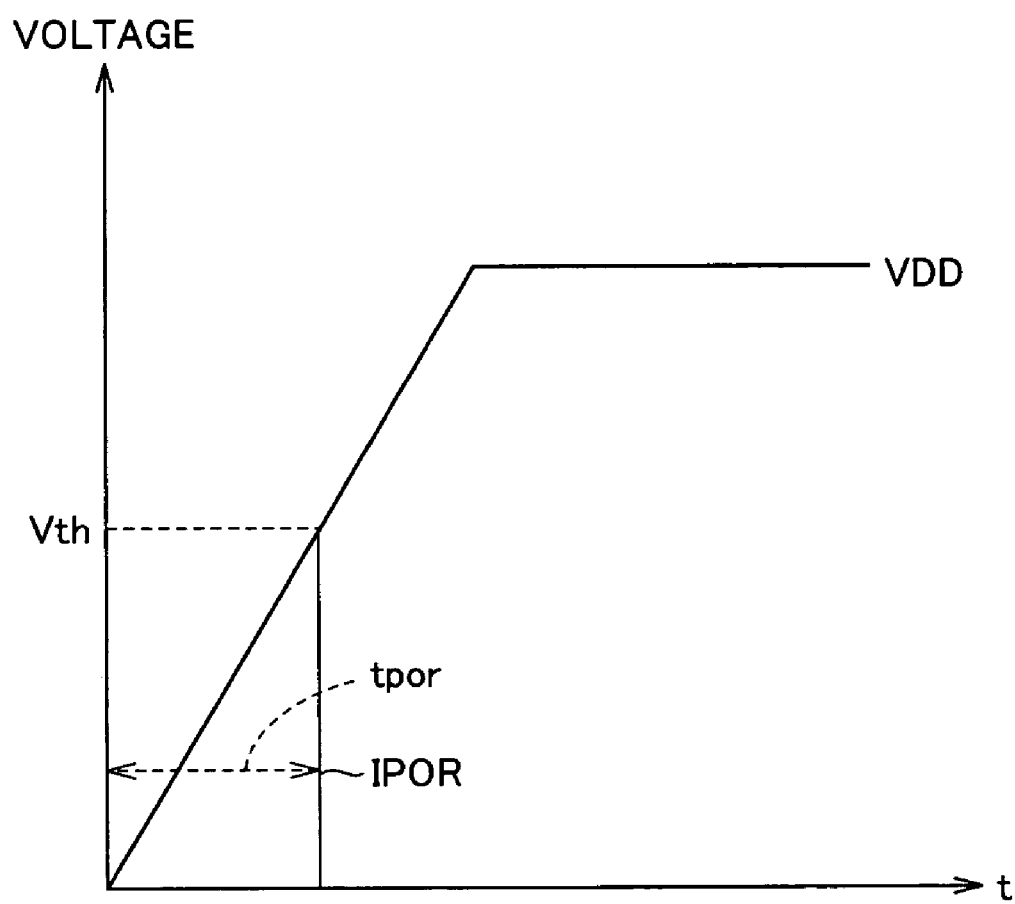
FIG. 20 is a waveform diagram for describing the generation of a control signal.

In FIG. 20, control signal IPOR, as described above, is produced from what is called a power-on reset circuit not shown. Control signal IPOR is set to 0 V for a predetermined time of length immediately following the turning on of power supply voltage VDD. In the case where power supply voltage VDD exceeds a predetermined threshold voltage Vth, control signal IPOR ("1") is output from the power-on reset circuit at the same level as power supply voltage VDD. Incidentally, power-on reset period tpor corresponds to control signal IPOR of 0 V.

Next, the generation of control signal SPT will be described. In initial state, control signal IPOR is "0". Thus, transistor 55 is turned on, node N0 is set to "1", and node N1 to "0". As a result, transistor 56 is turned on, so that inverter 57 and transistor 56 cooperate to latch the signal transmitted to node N1 at "0". Thus, control signal SPT is latched at "1". In the case where control signal IPOR ("1") is input, transistor 60 is turned on and node N0 is set to "0". Control signal SPT can thus be set to "0". In the case where fuse element 59 is cut off by electric blow or laser blow, the input of control signal IPOR ("1") is not affected at all, and therefore control signal SPT can be fixed to "1". In the case where the redundancy select operation is required, therefore, fuse 59 is cut off, thereby making it possible that the redundancy determining operation can be adapted to be always executed.

Figure 19B:
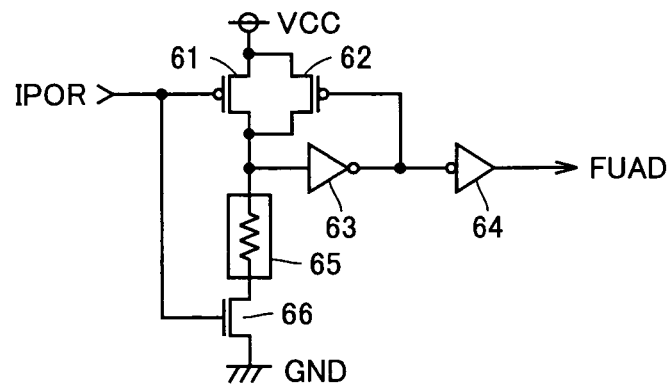

In FIG. 19B, a fuse address unit for generating fuse address FUAD<4:0> includes transistors 61, 62, inverters 63, 64, a fuse element 65 and a transistor 66. A circuit for setting 1-bit fuse address FUAD1 is shown. The connection is similar to the one described with reference to FIG. 19A, and therefore is not described again. Specifically, by electrically blowing or not blowing fuse element 65, fuse address FUAD of control signal IPOR (in "1" state) can be fixed. In other words, in the case where fuse element 65 is electrically separated, fuse address FUAD is set to "1". In the case where fuse element 65 is not electrically separated, on the other hand, fuse address FUAD is set to "0" in response to the input of control signal IPOR ("1"). In this way, fuse address FUAD1<4:0> can be set by blowing or not blowing fuse element 65 in accordance with the data level fixed.

Figure 19C:
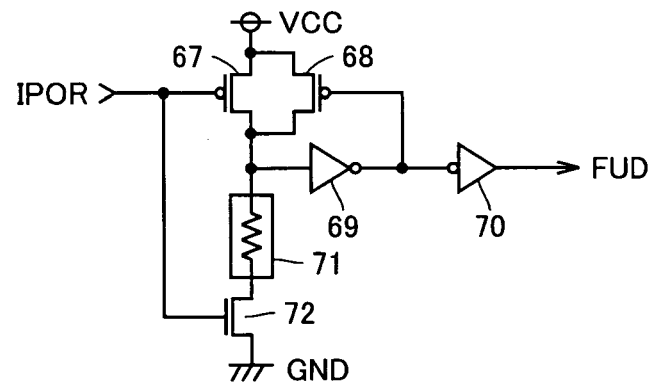

Referring to FIG. 19C, a fuse bit unit for generating fuse bit data FUD<3:0> includes transistors 67, 68, 72, inverters 69, 70 and a fuse element 71. A circuit for setting a 1-bit fuse bit data FUD1 is shown. The connection is similar to the one described with reference to FIG. 19A, and therefore is not described again. As for the operation, in response to the input of control signal IPOR, fuse bit data FUD is set, and in the case where fuse element 71 is blown off, fuse bit data FUD is set to "1", while in the case where the fuse element 71 is not blown off, fuse data bit FUD is set to "0". In this way, by blowing or not blowing the fuse element in accordance with the data level fixed, fuse data bit data FUD1<3:0> can be set.

Figure 21:
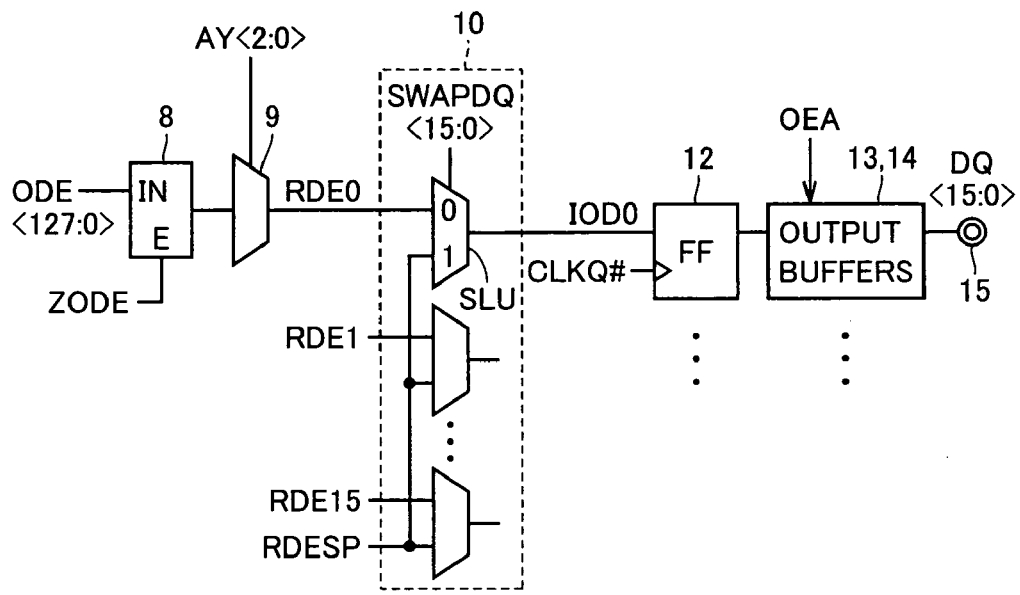
FIG. 21 is a schematic diagram showing circuits for defining the data output operation.

Referring to FIG. 21, this embodiment includes a latch circuit 8 for receiving and latching read data ODE<127:0>, a selector 9 for ⅛ selection, a data swap circuit 10 for executing the swap operation, a latch circuit 12 and output buffers 13, 14. Latch circuit 8 and selector 9 make up a data select circuit.

Latch circuit 8 latches read data ODE<127:0> based on control signal ZODE input thereto, as described above. Selector 9, based on internal address AY<2:0>, carries out ⅛ selection of 8-word read data ODE<127:0> and outputs 16-bit 1-word read data RDT<15:0>.

Data swap circuit 10 executes the process of replacing read data RDE<15:0> with redundant data signal RDESP read based on the redundancy determining operation.

After this replace operation, latch circuit 12 latches read data IOD<15:0> based on clock CLKQ#. Output buffers 13, 14, in response to control signal OEA, outputs the signal transmitted from latch circuit 12 to external terminal 15 as output data DQ<15:0>.

Figure 22:
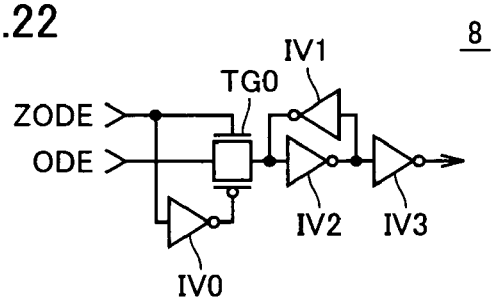
FIGS. 22 and 23 are diagrams showing a circuit configuration of a latch circuit.

FIG. 22 shows a one-bit latch circuit 8 including a transfer gate TG0 and inverters IV0 to IV3. In this case, a latch is configured of inverters IV1 and IV2. Latch circuit 8 is such that transfer gate TG0 is turned on based on the input of control signal ZODE and the same signal inverted through inverter IV0, and read data ODE is transmitted for latch operation, so that a signal of the same logic level is output from inverter IV3.

Figure 23:
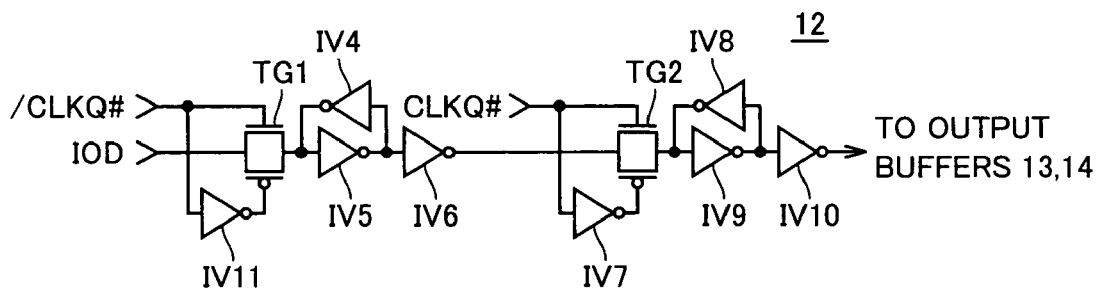

Referring to FIG. 23, latch circuit 12 includes transfer gates TG1, TG2 and inverters IV4 to IV11.

Transfer gate TG1, in response to the input of the inverted signal /CLKQ# of clock CLKQ# and CLKQ# inverted by inverter IV11, latches read data IOD by inverters IV4, IV5. Inverter IV6 inverts the signal output from inverter IV5 and outputs it to transfer gate TG2.

Transfer gate TG2, in response to the input of clock /CLKQ# and the signal /CLKQ inverted through inverter IV7, latches the signal by inverters IV8, IV9. Inverter IV10 inverts the signal output from inverter IV9 and outputs it to output buffers 13, 14.

Figure 24:
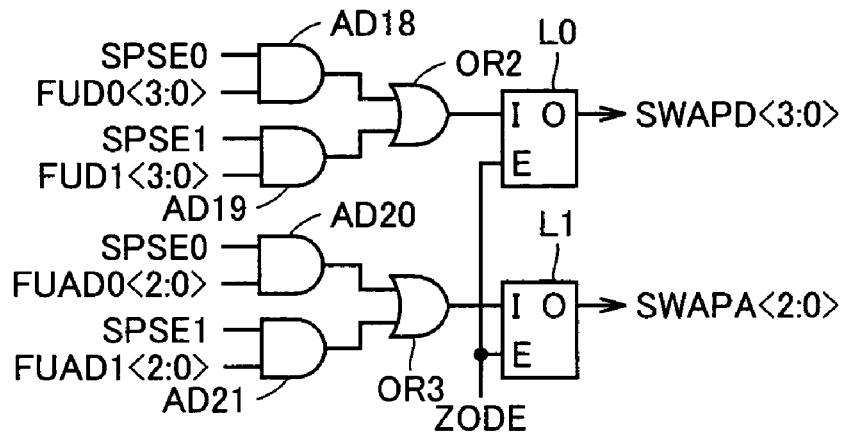
FIG. 24 is a diagram schematically showing the configuration of a redundancy control unit for generating the control signals output to a data swap circuit.

Referring to FIG. 24, redundancy control unit 50# for generating control signal SWAPDQ<15:0> output to data swap circuit 10 includes an AND circuit AD 18 for outputting the result of AND logic operation of control signal SPSE0 and fuse bit data FUD0<3:0>, an AND circuit AD19 for outputting the result of AND logic operation of control signal SPSE1 and fuse bit data FUD1<3:0>, an OR circuit OR2 for outputting the result of OR logic operation of the output signals of AND circuits AD18, AD19 to latch circuit L0, and a latch circuit L0 for outputting control signal SWAPD<3:0> in response to the input of control signal ZODE.

Also, redundancy control unit 50# includes an AND circuit AD20 for outputting the result of AND logic operation of control signal SPSE0 and fuse address FUAD0<2:0> to OR circuit OR3, an AND circuit AD21 for outputting the result of AND logic operation of control signal SPSE1 and fuse address FUAD1<2:0> to OR circuit OR3, an OR circuit OR3 for outputting the result of OR logic operation of the signals output from AND circuits AD20, AD21, to latch circuit L1, and latch circuit L1 for outputting the signal output from OR circuit OR3 as control signal SWAPA<2:0> in response to the input of control signal ZODE.

The circuit shown in FIG. 24 operates in such a manner that fuse address FUAD and fuse bit data FUD are latched in latch circuits L0, L1, respectively, in synchronism with control signal SPSE0 (SPSE1) in response to the input of control signal ZODE. Fuse bit data FUD and fuse address FUAD are thus output as swap data SWAPD<3:0> and swap address <2:0>, respectively.

Swap data SWAPD<3:0> and swap address <2:0> are generated by being latched in latch circuits L0, L1 by reason of the fact that internal address IAE used for executing the redundancy select operation of memory array 2, i.e., the read operation is different from internal address AY used for the data output operation for ⅛ selection in selector 9. By the time when the swap operation is performed in data swap circuit 10, for example, the read operation is already carried out in accordance with another internal address in memory array 2. In order to execute the swap operation based on the immediately preceding internal address, therefore, fuse bit data FUD and fuse address FUAD are latched anew as swap data SWAPD<3:0> and swap address SWAPA <2:0> using latch circuits L0, L1, respectively.

Figure 25:
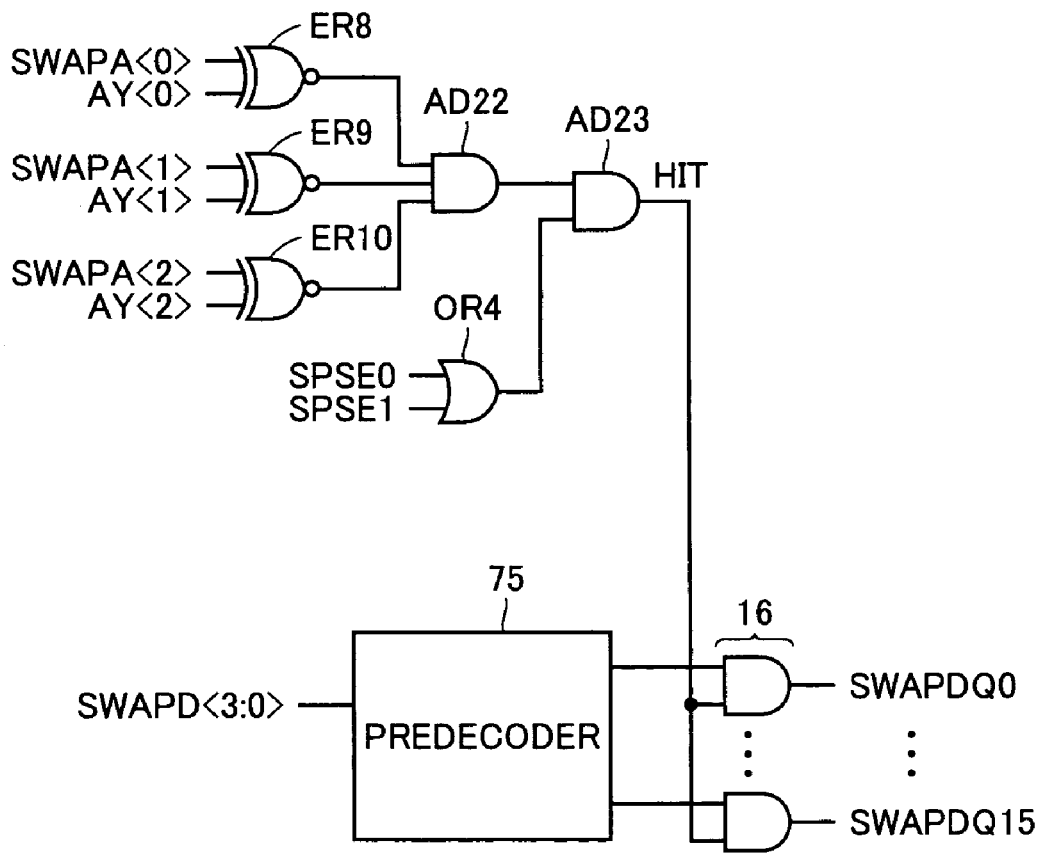
FIG. 25 is a diagram showing a circuit configuration of the signal generating circuit for generating a swapping control signal based on a swap data and a swap address.

Referring to FIG. 25, swap address SWAPA<2:0> and internal address IAE<2:0> are compared with each other, and a determination signal is output based on the comparison. Specifically, swap address SWAPA and internal address AY of each bit are compared with each other through logic circuits ER8 to ER10. AND circuit AD22, in response to the output signals of logic circuits ER8 to ER10, outputs a determination signal to AND circuit AD23.

OR circuit OR4, in response to the input of control signals SPSE0, SPSE1, outputs the result of OR logic operation thereof to AND circuit AD23, which in turn outputs control signal HIT in response to the input of the output signals from AND circuit AD22 and OR circuit OR4. In this case, control signal HIT is output in the case of reading word W for which the swap address SWAPA<2:0> is coincident with internal address AY<2:0> sequentially incremented by burst counter 23B.

Swap bit data SWAPD<3:0> is predecoded in predecoder 75, and in synchronism with control signal HIT output from AND circuit AD23, control signals SWAPDQ0 to SWAPDQ15 are generated.

Read data RDE<15:0> input based on control signals SWAPDQ0 to SWAPDQ15 thus generated are replaced with redundant read data RDESP in corresponding bits and output from data swap circuit 10 as read data IOD<15:0>.

In this configuration, the redundancy determination is carried out and the desired data signal can be output by replacing the corresponding bits with the redundant data signal.

THIRD EMBODIMENT

In the word line select operation in APS (Automatic Power Saving) mode, word line WL, once activated, is deactivated after the data of the sense amplifier is established a predetermined time later. Then, the same word line WL, if selected again in burst mode, is required to be reactivated, resulting in great current consumption for charge and discharge operation. According to the third embodiment, the operation of canceling the APS mode is carried out during the burst mode to reduce power consumption thereby to maintain the state in which word line WL is selected.

Figure 26:
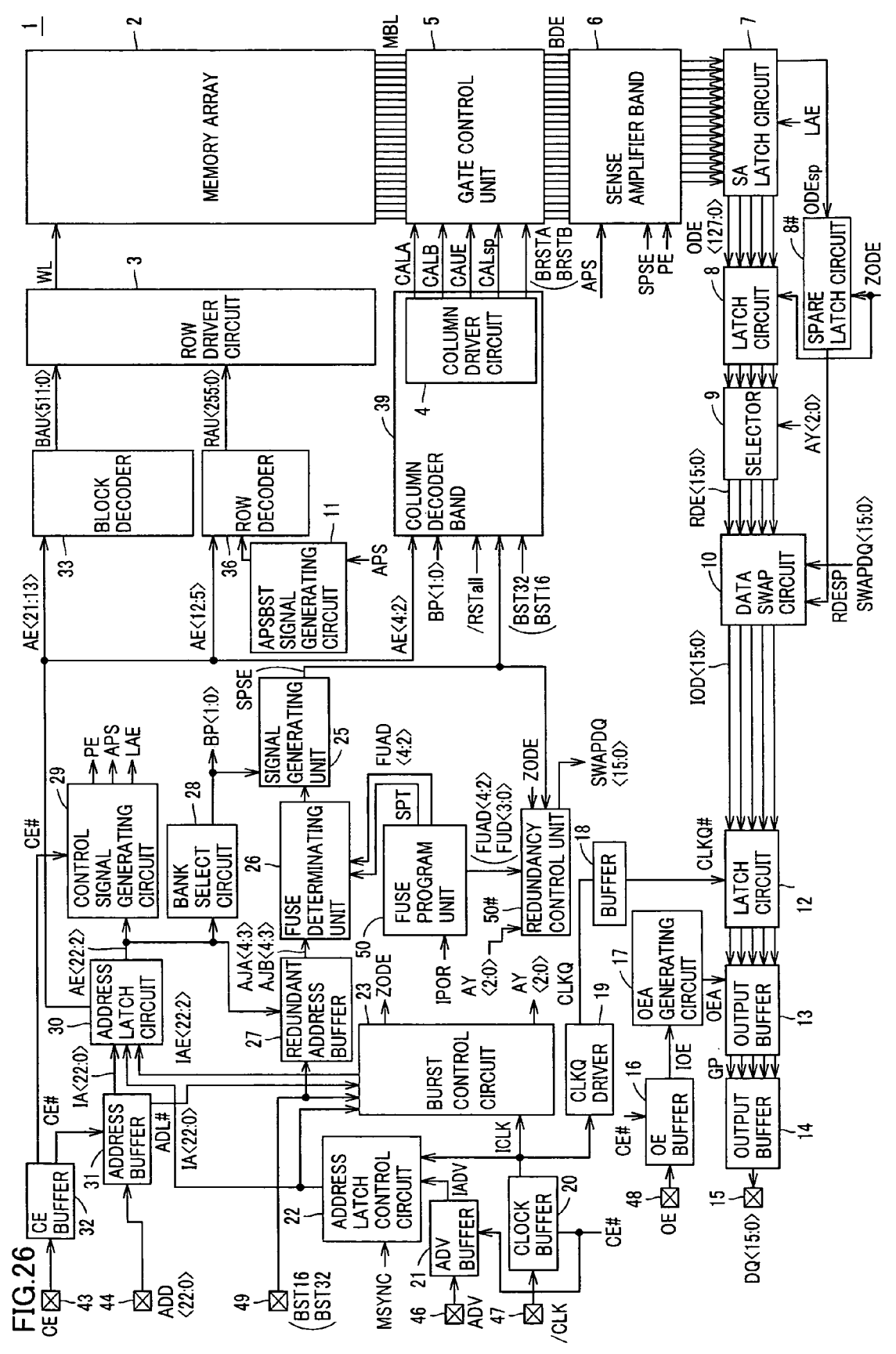

Referring to FIG. 26, memory device 1# according to the third embodiment is different in the provision of APSBST signal generating unit 11. The other points are the same as those described for memory device 1 and therefore not described in detail again.

APSBST signal generating unit 11 outputs control signal APSBST to row decoder 36 based on the input of control signal APS.

Figure 27:
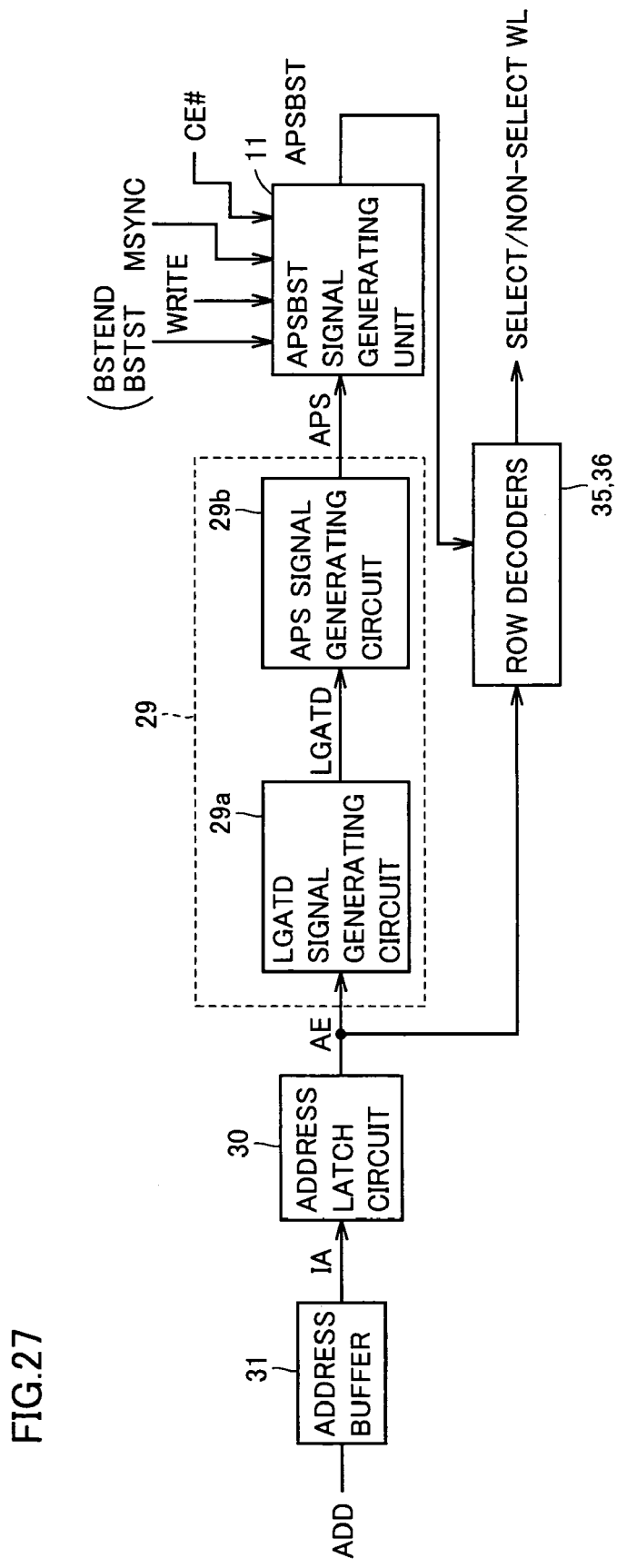
FIG. 27 is a schematic diagram for describing the flow of the addresses and the control signals in selecting a word line according to the third embodiment.

Referring to FIG. 27, address ADD is input to address buffer 31 thereby to generate internal address IA. Internal address IA is latched in address latch circuit 30, and output to control signal generating circuit 29 and row decoders 35, 36 as internal address AE from address latch circuit 30. Based on internal address AE output to row decoders 35, 36, the word line select/non-select operation is performed. Control signal generating circuit 29, in response to the input of internal address AE, generates control signal LGATD in LGATD signal generating circuit 29a and outputs control signal APS from APS signal generating circuit 29b.

In the configuration according to the third embodiment, description will be given of a method in which control signal APS is input to APSBST signal generating circuit 11, and based on control signal APSBT output, the APS mode or cancellation thereof is controlled. Specifically, a method in which the transmission of the logic level of control signal APS is cut off by APSBST signal generating circuit 11 will be described.

APSBST signal generating circuit 11 outputs control signal APSBST to row decoders 35, 36 based on the input of control signal APS, control signals BSTEND, BSTST, control signal WRITE, control signal MSYNC and control signal CE#.

In this case, control signal BSTST defines the starting of the burst mode, and control signal BSTEND defines the end of the burst mode. Control signal WRITE is input at the time of write operation.

Figure 28:
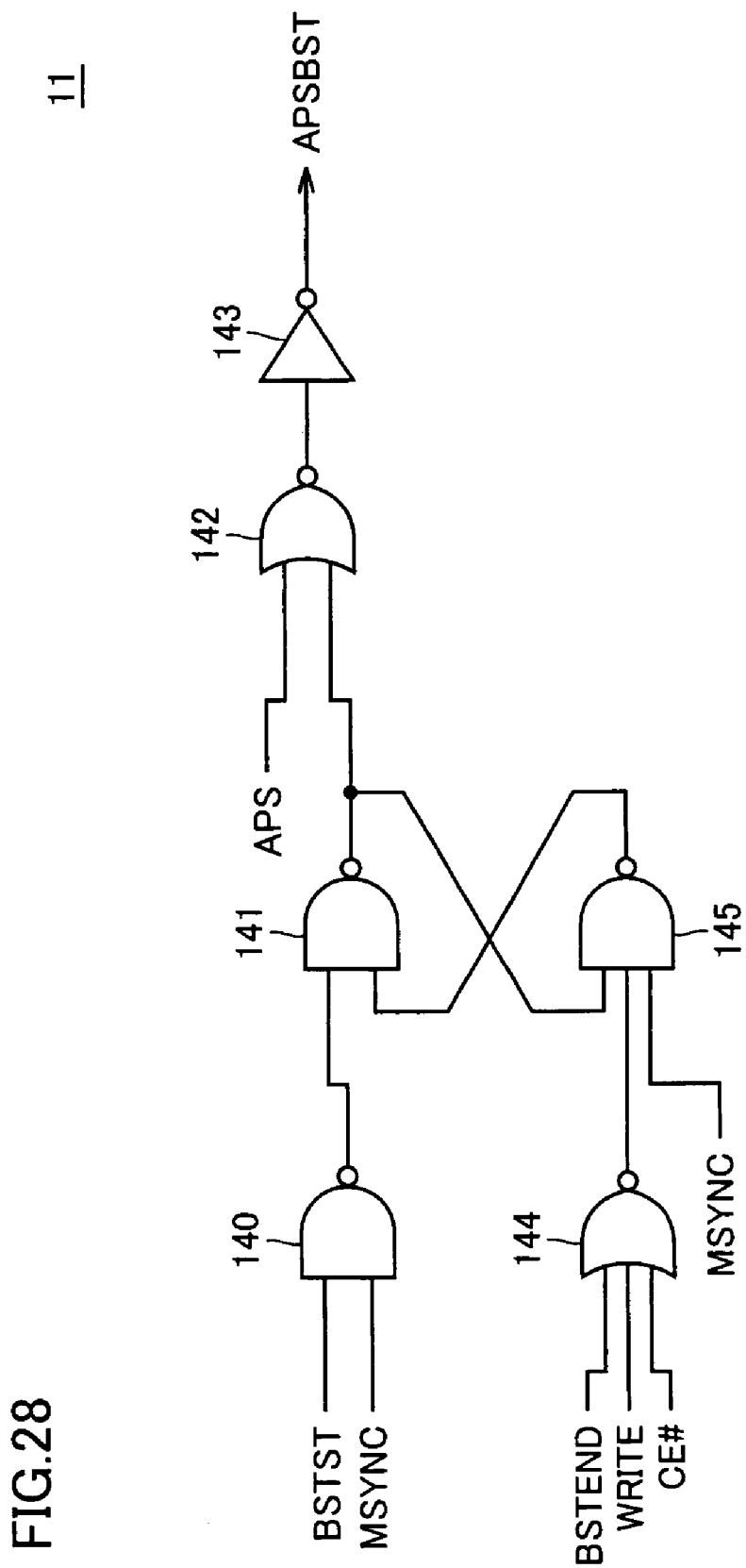
FIG. 28 is a diagram showing a circuit configuration of an APSBST signal generating circuit according to the third embodiment.

Referring to FIG. 28, APSBST signal generating circuit 11 according to the third embodiment includes NAND circuits 140, 141, 145, NOR circuits 142, 144 and an inverter 143. NAND circuit 140 outputs the result of NAND logic operation to NAND circuit 141 based on the input of control signal BSTST and control signal MSYNC. NAND circuit 141, in response to the input of the output signals of NAND circuit 140 and NAND circuit 145, outputs the result of NAND logic operation thereof to NOR circuit 142. NOR circuit 144, in response to control signal BSTEND, control signal WRITE and control signal CE#, outputs the NOR logic operation thereto to NAND circuit 245. NAND circuit 145, in response to the input of the output signal of NOR circuit 144, control signal MSYNC and the output signal of NAND circuit 141, outputs the result of NAND logic operation thereof to NAND circuit 141. NOR circuit 142, in response to control signal APS and the output signal of NAND circuit 141, outputs the result of NOR logic operation thereof as control signal APSBST through inverter 143.

When the burst operation starts, both control signal BSTST and control signal MSYNC are both "1", and therefore NAND circuit 140 outputs "0" signal to NAND circuit 141. NOR circuit 144 sets the output signal thereof to "1" in the case where control signal BSTEND, control signal WRITE and control signal CE# are set to "0". Also, control signal MSYNC is "1" as described above, and therefore the output signal of NAND circuit 145 is set to "0", while the output signal of NAND circuit 141 is fixed to "1". Assuming that control signal APS is set to "1" under this condition, the output signal of NOR circuit 142 is set to "0", and control signal APSBST inverted through inverter 143 is fixed to "1". After lapse of a predetermined time, on the other hand, control signal APS is set to "0". Since the other input node of NOR circuit 142 is fixedly set to "1", however, control signal APSBST remains fixed to "1". In other words, the transmission of control signal APS is cut off.

Even during the operation in APS mode, therefore, control signal APSBST for deactivating word line WL is "1", and therefore the word line is maintained. At the end of the burst operation, on the other hand, control signal BSTEND is set to "1". At the same time, the output signal of NOR circuit 144 is set to "0". The output signal of NAND circuit 144 receiving this signal, therefore, is set to "1", and the output signal of NAND circuit 140 is set to "1". Therefore, the output signal of NAND circuit 141 turns "0". As a result, the control signal APS and the output signal of NAND circuit 141 are both set to "0". Thus, the output signal of NOR circuit 142 is set to "1", and control signal APSBST is set to "0" through inverter 143. Then, the operation of selecting the word line selected is completed. In other words, the cutoff of transmission of control signal APS is canceled, and based on control signal APS, the word line select operation is ended.

In this configuration, as described above with reference to control signal BSTEND, the operation of selecting word line WL selected similarly to the foregoing case is terminated also in the case where control signal WRITE or control signal CE# turns "1".

Figure 29:
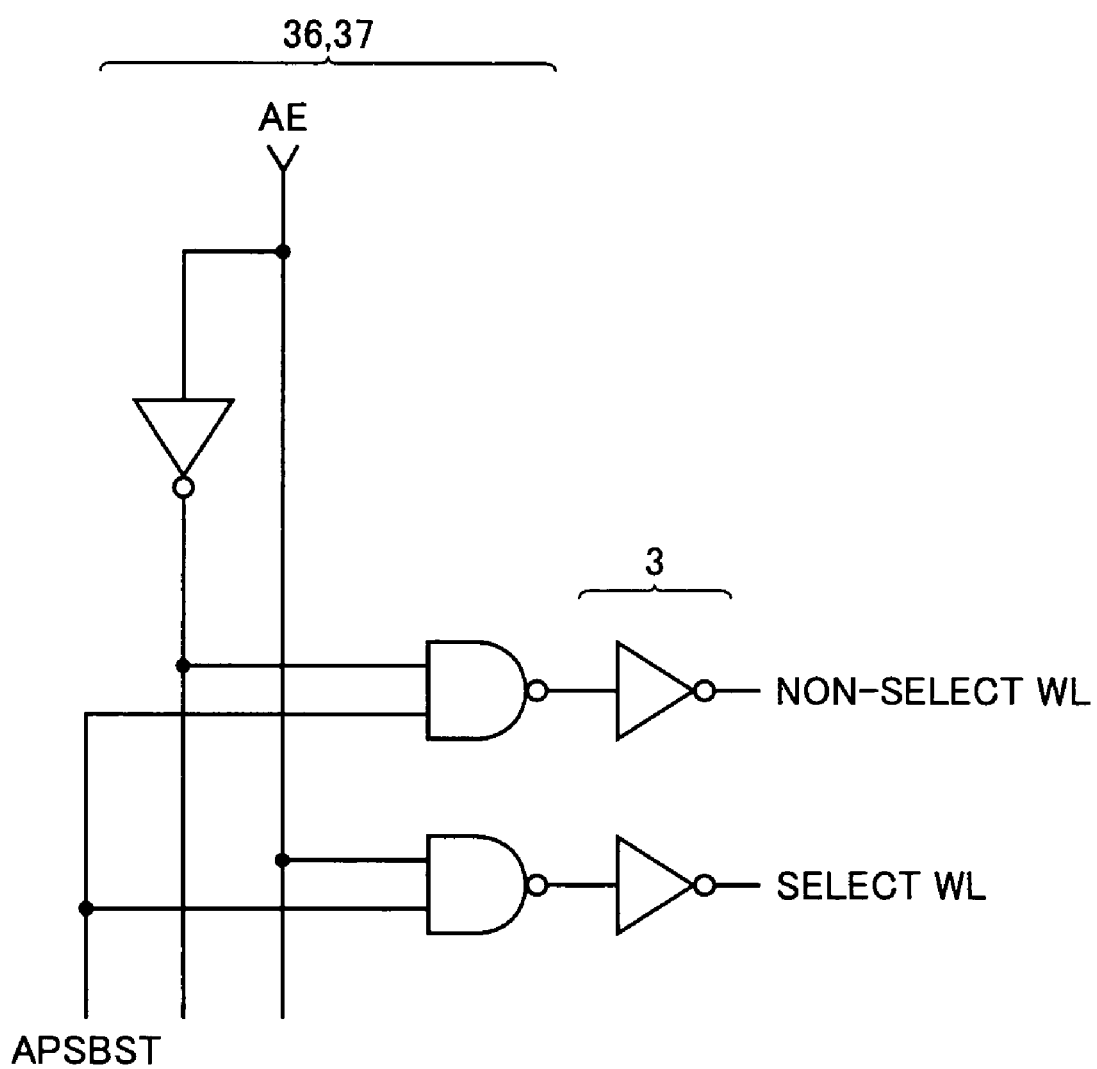
FIG. 29 is a schematic diagram for describing the relation between a word line select signal and a control signal according to the third embodiment.

With reference to FIG. 29, the relation between signal AE and control signal APSBST for selecting word line WL according to the third embodiment is described.

As shown in FIG. 29, the operation of selecting word line WL is carried out by decoders 36, 37. Since control signal APSBST is fixed to "1", the selected word line is kept activated. In the case where control signal APSBST is set to "0", on the other hand, the selected word line WL turns to a non-selected state.

With reference to FIG. 30, the activation period of control signal APSBST in APS mode will be described according to the third embodiment.

Address ADD is retrieved in synchronism with one of "0" state of control signal ADV at time point T1 0 or the rise of internal clock CLK. At the same timing, control signal BSTST is generated, and in synchronism with the rise of control signal BSTST and control signal APS ("1"), control signal APSBST is set to "1". Also, at time point T11, the next address ADD1 is retrieved, and also during this period, control signal APSBST is set to "1". Then, selected word line WL is kept selected.

At time point T11# a predetermined time after time point T11, control signal APS falls to "0" in APS signal generating circuit 41. This predetermined time is set based on the delay time of delay units 125 to 127 described above with reference to FIG. 6.

In the aforementioned case, however, control signal BSTEND, control signal WRITE or control signal CE is not set to "1", and therefore control signal APSBST is kept at"1".

Next, at time point T12, address ADD2 is input again, and at time point T112# a predetermined time of five clocks later after the input timing, control signal APS falls again to "0". At next time point T13 when the burst mode ends, control signal BSTEND, control signal CE# or control signal WRITE rises to "1", while control signal APSBST falls from "1" to "0". At the same time, the selected word line turns from selected to non-selected state.

As in the configuration according to the third embodiment, control signal APSPST is kept activated in burst mode during the burst period, so that word line WL is kept in selected state, thereby suppressing the power consumption due to wasteful charge/discharge operation or select/non-select operation.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor memory device comprising:
   an array of memory cells arranged in matrix, selected by an address by first address bits and second address bits less significant than said first address bits, said memory cells being divided into a first memory block and a second memory block based on the more significant bit of said second address bits;
   a burst address generating circuit for generating an address signal sequentially from a start address to start a read operation in bust mode for continuously reading a predetermined number of data of said memory cell array;
   a first select circuit corresponding to said first memory block including an address conversion circuit which, in the case where the most significant bit of said second address bits of said address signal meets predetermined conditions, converts an address conversion signal incremented first address bit of said address signal into the signal of said first address bits of said address signal, a first data of a predetermined number of memory cells being selected from said first memory block based on the output of said address conversion circuit;
   a second select circuit corresponding to said second memory block for selecting a second data of said predetermined number of memory cells from said second memory block based on said first address bits of said address signal; and
   a data select circuit for sequentially selecting said first data and said second data based on said second address bits of said address signal.

2. The semiconductor memory device according to claim 1, wherein
   said predetermined conditions are the fact that said start address is located in said second memory block, and said first data is read after selecting said second data.

3. The semiconductor memory device according to claim 1, wherein
   a select operation of said first select circuit and said second select circuit are performed in parallel to each other.

4. The semiconductor memory device according to claim 1, wherein
   said address conversion circuit converts said first address bits into the least significant address in the case where said first address bits of said start address input to said address conversion circuit represent the maximum value of a predetermined burst range.

5. The semiconductor memory device according to claim 1, wherein
   said data select circuit includes a latch circuit for holding and outputting said first data and second data,
   said latch circuit latches said first data and said second data in response to the transition of an activation signal from a first logic level to a second logic level, and
   said activation signal is fixed to said first logic level in normal operation mode.

6. The semiconductor memory device according to claim 1, wherein
said first select circuit includes a decoding circuit for receiving the output of said address conversion circuit,
said address conversion circuit selectively determines whether the address of said input address signal is converted or not and outputs selected one of said address signal and said address conversion signal, depending on whether an instruction signal to start said burst mode is activated or not, and
said decoding circuit is shared by said burst mode and a normal operation mode for generating the decode signal based on the output of said address conversion circuit regardless of whether said burst mode or said normal operation mode prevails.

7. The semiconductor memory device according to claim 1, further comprising:
another memory array including third and fourth memory blocks arranged in opposed relation to said first and second memory blocks, respectively;
third and fourth select circuits corresponding to said third and fourth memory blocks, respectively, and having similar functions to said first and second select circuits, respectively;
a first sense amplifier shared by said first select circuit and said third select circuit to sense said first data of a predetermined number of selected memory cells of said first memory block and said third memory block, respectively; and
a second sense amplifier shared by said second select circuit and said fourth select circuit to sense said second data of a predetermined number of selected memory cells of said second memory block and said fourth memory block, respectively, wherein
a series of the data read operation in one burst mode is carried out for selected one of the set of said first and said second memory blocks and the set of said third and fourth memory blocks.

8. The semiconductor memory device according to claim 1, further comprising:
a redundant memory array including a plurality of redundant memory cells arranged in matrix; and
a redundancy select circuit for selecting the redundant data from said redundant memory array based on said address signal and a redundant address stored in advance, wherein
said data select circuit includes a swap circuit for replacing at least a part of selected one of the first and second data of said selected predetermined number of memory cells with said redundant data.

9. The semiconductor memory device according to claim 8, wherein
said redundant address includes first redundant address bits corresponding to said first address bits and second redundant address bits corresponding to said second address bits,
said redundancy select circuit includes a redundant address conversion circuit for incrementing said first redundant address bits in the case where the most significant bit of said second address bits in said address signal meets predetermined conditions, and said redundancy select circuit selects said redundant data based on comparison between the first address bits output from said address conversion circuit and said first redundant address bits of said redundant address output from said redundant address conversion circuit.

10. The semiconductor memory device according to claim 9, further comprising:
a redundancy control circuit for controlling a replace operation of said swap circuit, wherein
said redundancy control circuit gives an instruction to perform said replace operation based on the comparison between said second redundant address bits of said redundant address and said second address bits incremented one by one from the first start address in said burst control circuit.

11. The semiconductor memory device according to claim 1, wherein
said memory array includes a plurality of word lines corresponding to a plurality of memory cell lines respectively,
said semiconductor memory device further comprising:
a word line select circuit for selectively activating one of said plurality of the word lines in response to an external instruction;
a deactivation circuit for transmitting a deactivation signal for deactivating said selected word line to said word line select circuit upon the lapse of a predetermined time length; and
a signal adjusting circuit for cutting off said deactivation signal transmitted from said deactivation circuit in said burst mode.

12. A semiconductor memory device executing a page read, comprising:
a memory cell array divided into a first memory block and a second memory block storing odd and even number pages, respectively;
a select portion accessing said first and second memory blocks based on an input address signal for executing a read operation;
a data select circuit for continuously reading a predetermined number of data in a burst mode, selecting a data sequentially from a start address to start the read operation, among a plurality of data included in continuous odd and even number pages read out from said first and second memory blocks; and
a burst address generating circuit incrementing said address signal for performing the next page read; wherein
said select portion includes first and second select circuits selecting continuous odd and even number pages included in said first and second memory blocks based on a part of bit of said address signal respectively, and
said first select circuit having an address conversion circuit increments, when a part of bits of said address signal meets a predetermined condition, said part of bits of said address signal for selecting a next odd page number.

* * * * *